United States Patent
Bossetti et al.

(10) Patent No.: US 11,159,065 B2
(45) Date of Patent: Oct. 26, 2021

(54) DETECTION OF OBJECT LOCATION AND ORIENTATION ON A WIRELESS CHARGE MAT

(71) Applicant: Apple Inc., Cupertino, CA (US)

(72) Inventors: Chad A. Bossetti, Santa Clara, CA (US); Christopher S. Graham, San Francisco, CA (US); David W. Ritter, San Jose, CA (US); Todd K. Moyer, Portland, OR (US); Steven G. Herbst, Berkeley, CA (US); Shimon Elkayam, Cupertino, CA (US); Nileshbhai J. Shah, Cupertino, CA (US); Stephen C. Terry, Cupertino, CA (US); Zaki Moussaoui, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 305 days.

(21) Appl. No.: 16/326,883

(22) PCT Filed: Sep. 20, 2017

(86) PCT No.: PCT/US2017/052569
§ 371 (c)(1),
(2) Date: Feb. 20, 2019

(87) PCT Pub. No.: WO2018/057656
PCT Pub. Date: Mar. 29, 2018

(65) Prior Publication Data
US 2019/0190324 A1    Jun. 20, 2019

Related U.S. Application Data

(60) Provisional application No. 62/397,616, filed on Sep. 21, 2016.

(51) Int. Cl.
*H02J 50/90* (2016.01)
*H02J 50/10* (2016.01)
*H02J 50/12* (2016.01)
*H02J 50/40* (2016.01)
*G01D 5/16* (2006.01)
*G01D 5/20* (2006.01)
*G01D 5/24* (2006.01)
(Continued)

(52) U.S. Cl.
CPC ........... *H02J 50/90* (2016.02); *G01D 5/16* (2013.01); *G01D 5/20* (2013.01); *G01D 5/24* (2013.01);
(Continued)

(58) Field of Classification Search
CPC .. H02J 50/90; H02J 50/10; H02J 50/12; H02J 50/40
(Continued)

(56) References Cited

U.S. PATENT DOCUMENTS 7,772,802 B2    8/2010    Manico et al.
8,169,185 B2    5/2012    Partovi et al.
(Continued)

FOREIGN PATENT DOCUMENTS

JP    2008-283789 A    11/2008
JP    2010130729 A    6/2010
(Continued)

*Primary Examiner* — Richard V Muralidar

(57) ABSTRACT

A wireless charging mat and method of operating the same. The wireless charging mat includes a detection system configured to determine a location and an orientation of an electronic device on the wireless charging mat. The location and orientation are determined based on detected locations of one or more structural features of the electronic device. The wireless charging mat is operated according to the detected location and orientation.

24 Claims, 16 Drawing Sheets

(51) Int. Cl.
*H02J 7/02* (2016.01)
*H01L 41/113* (2006.01)

(52) U.S. Cl.
CPC .............. *H02J 7/025* (2013.01); *H02J 50/10* (2016.02); *H02J 50/12* (2016.02); *H02J 50/40* (2016.02); *H01L 41/1132* (2013.01)

(58) Field of Classification Search
USPC ....................................................... 320/108
See application file for complete search history.

(56) References Cited

U.S. PATENT DOCUMENTS

| | | | |
|---|---|---|---|
| 2008/0211458 A1* | 9/2008 | Lawther | H02J 50/10 320/132 |
| 2011/0109264 A1 | 5/2011 | Choi | |
| 2012/0001592 A1 | 1/2012 | Fukaya | |
| 2012/0068550 A1 | 3/2012 | Boer et al. | |
| 2012/0161530 A1 | 6/2012 | Urano | |
| 2012/0313577 A1* | 12/2012 | Moes | H02J 50/402 320/108 |
| 2013/0207478 A1 | 8/2013 | Metcalf et al. | |
| 2015/0253158 A1 | 9/2015 | Lehtiniemi et al. | |
| 2016/0043567 A1 | 2/2016 | Matsumoto et al. | |

FOREIGN PATENT DOCUMENTS

| | | |
|---|---|---|
| JP | 2011-125137 A | 6/2011 |
| KR | 20100015828 A | 2/2010 |
| KR | 10-2012-30444 A | 3/2012 |
| KR | 20160032254 A | 3/2016 |
| WO | 2011067760 | 6/2011 |

* cited by examiner

DETECTION OF OBJECT LOCATION AND ORIENTATION ON A WIRELESS CHARGE MAT

This application claims priority to U.S. provisional patent application No. 62/397,616, filed Sep. 21, 2016, which is hereby incorporated by reference herein in its entirety.

FIELD

The described embodiments generally relate to wireless charging of an electronic device and, in particular, to systems and methods for detecting a location and an orientation of an electronic device placed on a charging surface of a wireless charging mat relative to one or more transmit coils disposed below the charging surface.

BACKGROUND

An electronic device can receive power wirelessly, such as via electromagnetic induction. For example, an electronic device can include a coil for receiving power (a "receive coil") and a transmitter device can include a coil for transmitting power (a "transmit coil"). The electronic device is positioned nearby the transmitter device so that the transmit coil can transfer power to the receive coil via mutual induction.

The efficiency of the power transfer is affected by, among other things, the proximity and alignment of the receive coil relative to the transmit coil. More specifically, if a receive coil is not aligned with—or is poorly aligned with—a transmit coil, the amount of power received by the electronic device is reduced. To compensate, the transmitter device typically increases its power output, thereby lowering the power-transfer efficiency of the system.

SUMMARY

Embodiments described herein generally relate to a wireless charging device (e.g., a wireless charging mat) configured to detect a location and an orientation of an electronic device on a charging surface of the wireless charging device. In some embodiments, a wireless charging mat includes an enclosure, a set of transmit coils, and a detection system. Typically, the enclosure has an upper surface or a charging surface on which an electronic device may be placed. The set of transmit coils transmit power wirelessly to the electronic device.

The electronic device includes a housing, and the detection system detects position(s) of structural feature(s) of the housing relative to the upper surface or charging surface of the wireless charging mat. Thereafter, the detection system can determine a location and an orientation of the electronic device relative to the upper surface or charging surface based on the relative positions of the structural features.

In some examples, a detection system of a wireless charging mat such as described herein applies a high-frequency signal (e.g., a ping) to one or more of the transmit coils. The detection system thereafter monitors the transmit coils for any current or voltage spike that may be associated with the presence of one or more metal features of an electronic device housing. Thereafter, the detection system can determine, estimate, or approximate the location and/or orientation of one or more structural features of the electronic device based on one or more characteristics (e.g., amplitude, phase, and so on) of the current or voltage spikes received at different transmit coils. Thereafter, the detection system can determine, estimate, or approximate the position of a receive coil within the electronic device.

In some examples, a detection system includes a set of capacitive electrodes disposed on or below the upper surface or charging surface of the wireless charging mat. The capacitive electrodes experience a change in capacitance in response to a nearby electronic device, and may determine the location and orientation of the electronic device based on a comparison of the changes in capacitance of different electrodes.

In some examples, a detection system includes a set of strain sensors that detect a deflection of the upper surface or charging surface in response to the electronic device contacting the upper surface or charging surface. In some examples, a detection system includes a piezoelectric sensor configured to detect a deflection of the upper surface in response to the electronic device contacting the upper surface. The location and orientation of an electronic device on the upper surface may be determined based on the detected deflection of the upper surface.

Further embodiments described herein relate to methods for charging an electronic device on a wireless charging mat. Such methods typically include the operations of detecting positions of two or more non-charging structural features of the electronic device relative to a charging surface of the wireless charging mat and, thereafter, determining, estimating, or approximating a location and an orientation of the electronic device relative to the charging surface. In some embodiments, the method further includes the operation of determining a position of a receive coil within the electronic device relative to the charging surface or, more particularly, determining the position of the receive coil relative to one or more transmit coils associated with the charging surface. Thereafter, a transmit coil can be selected based on the position of the receive coil.

BRIEF DESCRIPTION OF THE DRAWINGS

The disclosure will be readily understood by the following detailed description in conjunction with the accompanying drawings, wherein like reference numerals designate like elements.

FIG. 2C depicts an example electronic device having resonant structures detectable by a wireless charging mat.

FIG. 2D depicts another example electronic device having resonant structures detectable by a wireless charging mat.

FIG. 2E depicts yet another example electronic device having a pattern of resonant structures detectable by a wireless charging mat.

FIG. 3D depicts an example electronic device having capacitive structures detectable by a wireless charging mat.

FIG. 3E depicts another example electronic device having capacitive structures detectable by a wireless charging mat.

FIG. 3F depicts yet another example electronic device having a pattern of capacitive structures detectable by a wireless charging mat.

Figure 1A:
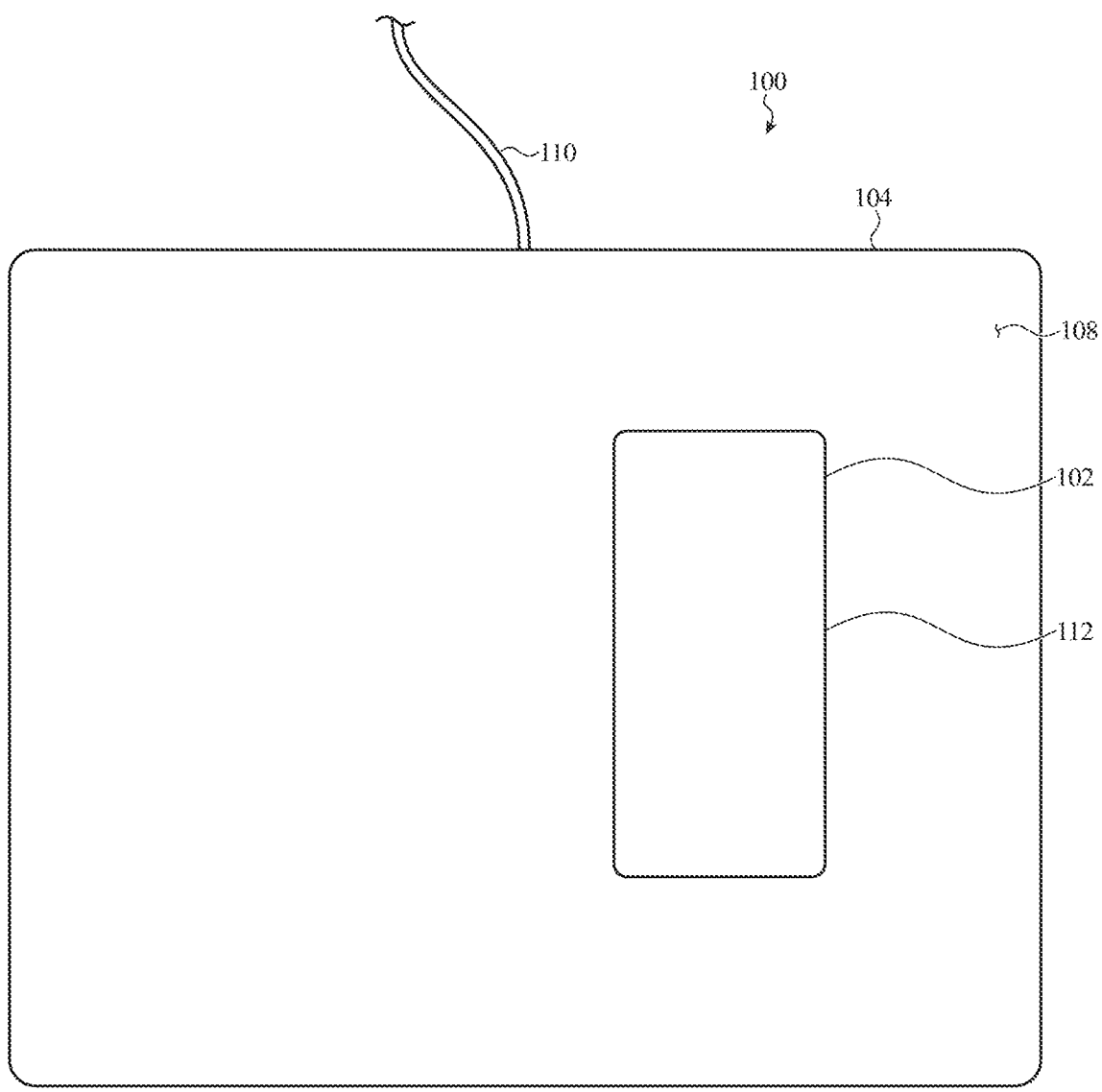
FIG. 1A depicts a wireless charging mat accommodating a portable electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings hereof), and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The following disclosure relates to systems and methods for operating a wireless charging device (e.g., a wireless charging mat) to detect a location and an orientation of an object (e.g., an electronic device) near or in contact with the wireless charging device. A wireless charging mat may be used to provide power to any stationary or mobile electronic device including a desktop computer, a laptop computer, a tablet computer, a cellular telephone, a peripheral device, an accessory device, a wearable device, a vehicle or aeronautical control system, an industrial control system, an appliance, and so on. The wireless charging mat may take on a variety of shapes and sizes. In some embodiments, the wireless charging mat may provide power to multiple electronic devices simultaneously.

Generally, a wireless charging mat such as described herein is configured to transfer power to an electronic device without use of wires between the wireless charging mat and the electronic device. The wireless charging mat may incorporate a transmit coil, capacitive charging plate, or similar transmitting element configured to transmit power wirelessly, for example through generating a magnetic or electric field to induce a voltage or current respectively in a corresponding receive coil in an electronic device. The induced voltage or current may be used by the electronic device to power components, charge a battery, and so on.

For simplicity of description, the embodiments that follow are described in reference to an inductive power transfer system including a wireless charging mat and one or more electronic devices, but such a configuration may not be required. In particular, it is understood that the systems, methods, and techniques described herein may be applied or modified in other implementations to detect, estimate, or approximate the position, location, and/or orientation of any suitable object relative to any suitable surface.

As noted with respect to other embodiments described herein, a wireless charging mat typically includes at least one transmit coil and an electronic device that can receive power from the wireless charging mat typically includes at least one receive coil. In operation, the transmit coil is energized with an alternating current; a time-varying magnetic flux field is produced by the transmit coil in response. The magnetic flux field induces an alternating current within the receive coil of the electronic device.

As noted above, the efficiency of power transfer from the wireless charging mat to the electronic device is affected by the proximity between and the relative alignment of the transmit coil and the receive coil. For example, if the receive coil is located away from the transmit coil, it may be subject to attenuated magnetic flux, resulting in a smaller induced current and lower received power. Similarly, some orientations of the electronic device may reduce the induced current, for example due to interference introduced by objects, such as other components of the electronic device. In response to the lower received power, a conventional wireless charging mat increases the output power of the transmit coil, resulting in undesirably reduced power efficiency.

One solution to the inefficiencies identified above is to incorporate more than one transmit coil in a wireless charging mat. The wireless charging mat transmits power via a transmit coil selected after communicating with the electronic device. The wireless charging mat may activate individual transmit coils sequentially or in a pattern until the electronic device receives a transmit coil. The electronic device signals the wireless charging mat that the electronic device is prepared to begin receiving power consistently. The electronic device and the wireless charging mat then establish a communication channel and negotiate a level of power needed by the electronic device.

However, the negotiation between the electronic device and the wireless charging mat delays the time at which the electronic device begins receiving power, thereby increasing charging time. Further, when the conventional wireless charging mat is idle, sequentially powering each transmit coil consumes power.

Accordingly, embodiments described herein relate to power-efficient means of determining a location and orientation of an electronic device placed on a wireless charging mat including a number of transmit coils. Once the location and orientation are determined, a transmit coil best positioned for efficient power transfer can be selected and energized without expressly requiring feedback from the electronic device.

For example, a wireless charging mat can include a detection system configured to determine a location and an orientation of an electronic device on the surface of the wireless charging mat. An example detection system may operate via inductive sensing, while other detection systems may operate via capacitive sensing or pressure sensing. The wireless charging mat may further operate one or more transmit coils according to the detected location and orientation of the electronic device.

The detection system may be configured to detect structural features of objects on the charging surface of the wireless charging mat. The detected structural features may include the size, shape, locations of boundaries, and so on of objects on the charging surface. With these detected features, the detection system may determine a position and an orientation of an object on its charging surface, and may further determine a type of the object. For example, the detection system may be configured to distinguish an electronic device from a foreign object. The detection system may determine, based on features such as the size and shape of an object, that it is not a suitable electronic device for charging, and transmit coils near the foreign object may not be activated.

In other examples the detection system may be configured to identify an electronic device and/or attributes of the electronic device. The detection system may be configured to detect non-charging structural features, and may additionally or alternatively detect structural features of a housing of the electronic device. The detection system may further detect distinct features of the electronic device, such as its size, features such as rounded edges, and so on, by which it may be identified as an accepted electronic device for power transfer. The detection system may further determine, based on the distinct features, a location of a receive coil, locations of other components, and/or an amount of power to provide to the electronic device, and so on. The wireless charging mat may operate according to these determinations, such as by selecting the nearest transmit coil to the receive coil and adjusting voltage, current, and/or power according to the needs of the device.

In some examples, the detection system may additionally or alternatively determine an identity of an electronic device, such as whether the device is a phone, watch, or tablet. In other cases, the detection system may determine a manufacturer of the electronic device, a model of the electronic device, and so on. In some examples, the wireless charging mat may have a memory that stores a lookup table or other data structure for identifying or categorizing an electronic device or attributes of an electronic device. The wireless charging mat may compare outputs of the detection system against the lookup table, and operate according to the stored information (e.g., identifying a location of a receive coil or other components within the electronic device).

Reference is made in this disclosure to a detection system configured to determine a location and an orientation of an electronic device on the surface of a wireless charging mat. Such an electronic device may be associated with a cover or similar element (e.g., a cover with or without a power repeating element), which cover may be interposed between the electronic device and the cover sheet. It should be understood that references to the electronic device being "on the surface," "on the charging surface," and so on are inclusive of an electronic device being associated with such a cover.

These and other embodiments are discussed below with reference to FIGS. 1A-7. However, those skilled in the art will readily appreciate that the detailed description given herein with respect to these figures is for explanatory purposes only and should not be construed as limiting.

Figure 1B:
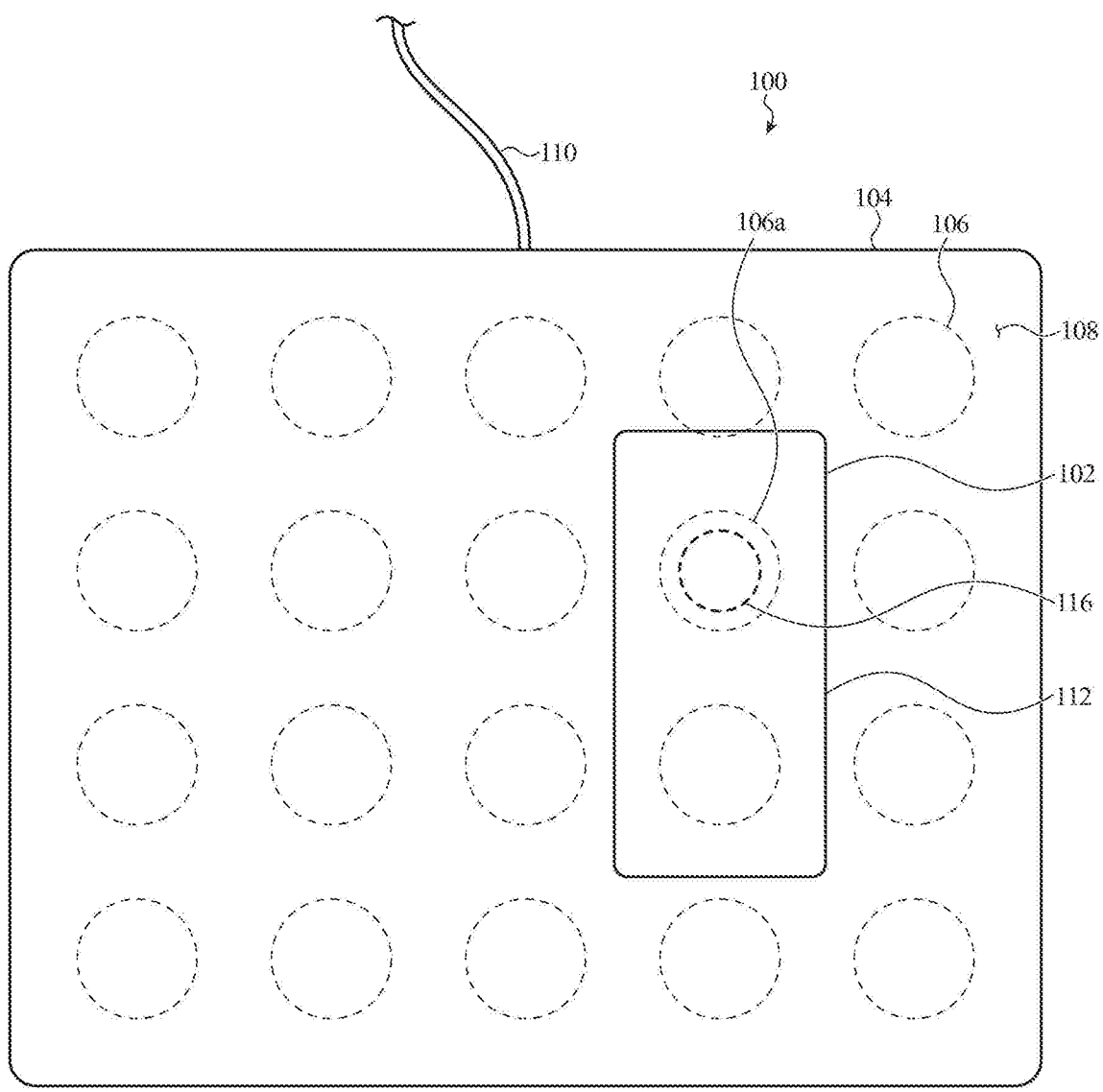
FIG. 1B depicts the wireless charging mat and the portable electronic device of FIG. 1A, specifically illustrating a receive coil of the electronic device aligned with a transmit coil of the wireless charging mat.
Figure 1C:
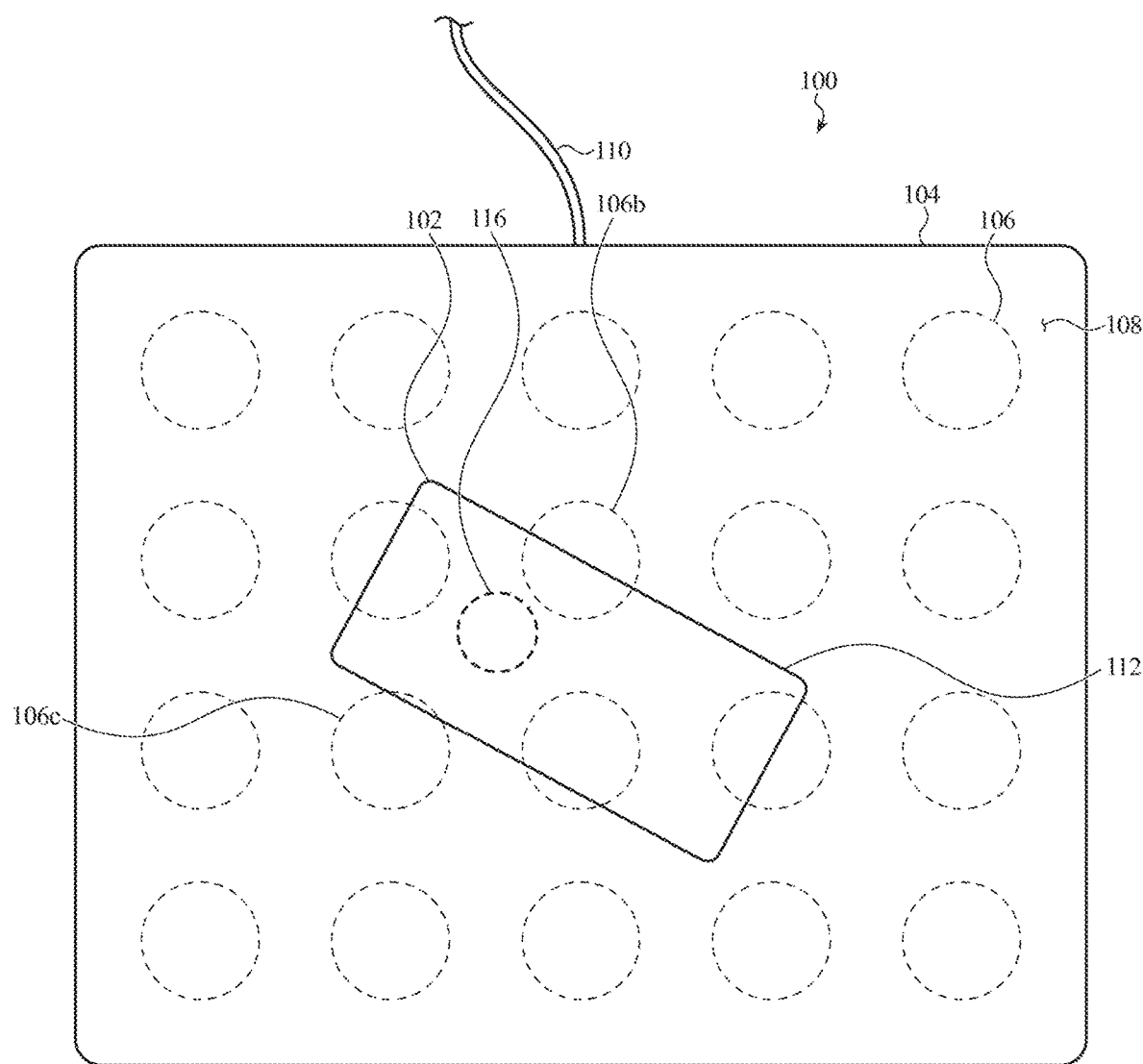
FIG. 1C depicts the wireless charging mat and the portable electronic device of FIG. 1B, specifically illustrating the receive coil of the electronic device not aligned with any transmit coil of the wireless charging mat.

Generally and broadly, FIGS. 1A-1C depict a wireless charging mat 100 that accommodates a portable electronic device 102 on the charging surface 108 of the wireless charging mat 100. The wireless charging mat 100 is configured to wirelessly transfer energy to the electronic device 102. The wireless charging mat 100 includes a housing 104 (e.g., an enclosure) to enclose electronic, mechanical, and/or structural components. For example, the housing 104 may enclose one or more inductive transmit coils 106 as depicted in FIGS. 1B and 1C. The transmit coils 106 may perform the transfer of energy to the electronic device 102. Additional components may be included within the housing 104, such as those depicted in FIG. 5.

The housing 104 of the wireless charging mat 100 can be formed of one or more components operably connected together, such as an upper piece and a lower piece. Alternatively, the housing 104 can be formed of a single piece. The housing 104 may be formed from a variety of materials including, but not limited to, reinforced glass, plastic, metal, artificially grown corundum, and any combination of materials.

The housing 104 may include a charging surface 108 on which the electronic device 102 rests. In many embodiments the charging surface 108 may be substantially planar, while in other embodiments the charging surface 108 may be curved, stepped, or another suitable geometric shape. The charging surface 108 may define a region of the wireless charging mat 100 positioned above one or more transmit coils 106 (as depicted in FIGS. 1B and 1C), such that when the electronic device 102 is placed on the charging surface 108 one or more transmit coils, such as the transmit coil 106, may be activated to transfer energy to the electronic device 102.

The charging surface 108 may entirely cover an upper surface of the wireless charging mat 100. In other embodiments the charging surface 108 may cover a portion of the upper surface, or the charging surface 108 may cover multiple surfaces of the wireless charging mat 100. The wireless charging mat 100 may be sized and/or shaped to maximize the available charging surface 108. For example, the wireless charging mat 100 may be sized to transmit energy to multiple electronic devices 102, of varying size and shape, simultaneously. In the example embodiment depicted in FIGS. 1A-1C the wireless charging mat 100 is substantially rectangular in shape across the charging surface 108. In other embodiments, the wireless charging mat 100 may be circular, square, triangular, or another suitable geometric shape (including non-regular geometric shapes).

The transmit coils 106 may be a set or array of transmit coils 106, as illustrated in FIGS. 1B and 1C. In some embodiments, the wireless charging mat 100 may include multiple arrays of transmit coils 106, arranged in overlapping or partially overlapping layers, to increase the area of the charging surface 108 which may be directly over a transmit coil 106. In the illustrated embodiments, a single layer of transmit coils 106 is shown for clarity. Each transmit coil 106 may be individually controllable such that a particular transmit coil 106 or set of transmit coils 106 may be activated while others are inactive. This may further provide for charging multiple electronic devices simultaneously.

In the illustrated embodiment, the wireless charging mat 100 may be connected to a power source by a cord or connector 110. For example, the cord or connector 110 can carry alternating current power from a wall outlet or similar source to the wireless charging mat 100. In some examples, the wireless charging mat 100 may receive power from a direct current source, such as a battery. Similarly, although the illustrated embodiment is shown with the connector 110 coupled to the housing 104 of the wireless charging mat 100, the connector 110 may be connected by any suitable technique. For example, the connector 110 may be removable and may include a connector that is sized to fit within an aperture or receptacle defined by the housing 104 of the wireless charging mat 100.

The electronic device 102 can be any electronic device that is configured to receive energy wirelessly. As shown in FIGS. 1A-1C, the electronic device 102 is implemented as a mobile telephone. However, it is understood that other embodiments can implement the electronic device 102 differently, such as, for example, a laptop or desktop computer, a tablet computing device, a gaming device, a display, a digital music player, a wearable computing device or display, a health monitoring device, and so on.

The electronic device 102 includes a housing 112, which may form an outer surface or partial outer surface and protective case for the internal components of the electronic device 102. The electronic device 102 further includes a battery for supplying power to the electronic device 102 and an internal inductive receive coil 116, as depicted in FIGS. 1B and 1C. The electronic device 102 may have additional components, including battery charging circuitry. The receive coil 116 is configured to interact with a transmitting source (e.g., a transmit coil 106 in the wireless charging mat 100) to provide power to components and/or charge the battery of the electronic device 102.

In some embodiments, the wireless charging mat 100 includes a detection system (illustrated in examples below with respect to FIGS. 2A-5). The detection system may detect (e.g., estimate, approximate, measure, determine, or otherwise obtain) the location and the orientation of the electronic device 102. The detection system may form part of a control system for the transmit coil 106, and may improve charging efficiency and/or decrease charging time for a battery of the electronic device 102.

For example, as depicted in FIG. 1B, the receive coil 116 within the electronic device 102 is substantially aligned with a transmit coil 106a. The detection system may detect that the electronic device 102 is in this position based on non-charging structural features of the electronic device 102 (e.g., features of the housing 112, features which do not include the receive coil 116). The detection system may further detect the orientation of the electronic device 102 relative to the charging surface 108. From the position and orientation of the electronic device 102, the wireless charging mat 100 may be configured to make further determinations (e.g., to activate the transmit coil 106a).

For example, the wireless charging mat 100 may determine the location of the receive coil 116 based on the position and orientation of the electronic device 102. In some embodiments, the wireless charging mat 100 may have memory storing a lookup table or other data structure for identifying an electronic device (e.g., based on distinct features such as the size and shape of the housing 112). The wireless charging mat 100 may additionally determine the location of other features and/or components of the electronic device 102. In the example of FIG. 1B, the wireless charging mat 100 may determine (e.g., via control circuitry) that the transmit coil 106a is the optimal transmit coil 106a for transmitting power to the receive coil 116 based on the position and orientation of the electronic device 102 relative to the charging surface 108 and/or the transmit coil 106a. The wireless charging mat 100 may then activate the particular transmit coil 106a, and may, in some embodiments, also activate additional transmit coils 106.

As depicted in FIG. 1C, the receive coil 116 of the electronic device 102 may not be precisely aligned with any of the transmit coils 106. In this example, the detection system may detect the location and orientation of the electronic device 102, and may determine that the receive coil 116 is not well aligned with any transmit coil 106 (e.g., in a manner similar to the determination made in the example of FIG. 1B). Due to the poor alignment, power transfer to the receive coil 116 may be inefficient. The electronic device 102 may require a minimum induced current at the receive coil 116 in order to accept a power transfer. In a conventional wireless charging mat 100, power delivered to a transmit coil 106 may be increased to compensate and increase the induced current, lowering the efficiency of the power transfer. This may further cause overheating of other components or similar undesirable conditions. Consequently, the wireless charging mat 100 may not activate any transmit coil 106 based on the detected position and orientation of the electronic device 102. The wireless charging mat 100 may further indicate that it will not charge the electronic device 102 (e.g., through visual and/or auditory indicia, communication with the electronic device 102, and so on).

In other embodiments, the wireless charging mat 100 may determine that in spite of the poor alignment some power transfer may be achieved. In such a case, the wireless charging mat 100 may activate one or more transmit coils 106 which may still achieve power transfer based on the particular position and orientation of the electronic device 102. For example, the wireless charging mat 100 may determine that the nearest transmit coil 106b would most efficiently transfer power and energize the nearest transmit coil 106b as a result. This may improve efficiency by selecting a better positioned transmit coil 106b, rather than increasing power to another transmit coil 106c. Alternatively, the wireless charging mat 100 may activate another transmit coil 106c based on other considerations (e.g., a determination that internal components of the electronic device 102 may interfere with power transfer from the nearest transmit coil 106b).

In still other examples, two or more transmit coils 106b, 106c may be activated. Due to the misalignment of the receive coil 116 to any transmit coil 106, the power transferred by any individual transmit coil 106 may be insufficient for the needs of the electronic device 102. The wireless charging mat 100 may compensate for this loss through energizing multiple transmit coils 106b, 106c. The transmit coils 106b, 106c may be selected due to appropriate characteristics (e.g., based on proximity to the receive coil 116 and/or each other, the amount of power each would transmit, and so on). In some cases, two or more transmit coils 106b, 106c may be activated with a lower total power consumption than would be required to operate a single transmit coil 106b under a high power output to achieve the same power transfer, resulting in improved efficiency.

The detection system of the wireless charging mat 100 may also be configured to identify a type of the electronic device 102. For example, the detection system may distinguish between a tablet device, a phone, a watch, and so on. In other examples, the detection system may distinguish between devices by manufacturer, model, device generation, and so on.

In some embodiments, the detection system may identify a type of the electronic device 102 by recognizing features, such as size and shape of the electronic device 102. The detection system and/or other circuitry may contain memory storing a lookup table or other data structure for identifying the type of the electronic device 102. The recognized features may be compared to information stored in the lookup table or other data structure. In other embodiments, the electronic device 102 may include a particular signature (e.g., resonant or capacitive structures, see, e.g., FIGS. 2E, 3F) which may be compared to information stored in the lookup table to identify the type of electronic device 102.

The lookup table may additionally include information relevant to transferring power to each type of electronic device 102. For example, the lookup table may indicate a location and number of receive coils 116, an amount of power needed, and so on. The operation of the wireless charging mat 100 may be adjusted according to the type of electronic device 102 once identified.

The wireless charging mat 100 may also be configured to communicate with a nearby electronic device 102. Both the wireless charging mat 100 and the electronic device 102 may include a communication interface to facilitate transmission of data to or from other devices. For example, a communication interface can transmit electronic signals via a wireless connection. In one embodiment, a communication signal is transmitted to the wireless charging mat 100 and/or to the electronic device 102 to permit the wireless charging mat 100 and electronic device 102 to communicate with one another. Examples of wireless connections include, but are not limited to: cellular, Wi-Fi, Bluetooth, infrared, acoustic, optical, inductive, and Near Field Communication. In other embodiments, a communication link may be established across linked pairs of transmit coils 106 and receive coils 116 by the same or similar techniques.

The communication interfaces of the wireless charging mat 100 and electronic device 102 may allow for communications to further facilitate charging. For example, the detection system may be enhanced by communications between the wireless charging mat 100 and electronic device 102 (e.g., providing or refining identification of the device, location of features, and so on). The communications may pertain to other aspects of the charging operation, such as battery status, temperature, and so on.

The foregoing embodiments depicted in FIGS. 1A-1C and the various alternatives thereof and variations thereto are presented, generally, for purposes of explanation, and to facilitate an understanding of various possible wireless charging systems that can incorporate a detection system such as described herein.

Generally and broadly, FIGS. 2A-4D depict examples of a wireless charging mat having a detection system configured to detect structural features of an electronic device in order to determine a location and orientation of the electronic device. A detection system generally includes a sense element configured to detect positions of structural features of objects placed on the charging surface, such as features of the housing of the electronic device and/or non-charging structural features. From the positions of structural features detected by the sense element, the detection system may further determine a position and orientation of the electronic device with respect to the charging surface.

As illustrated further below, a sense element may operate under an appropriate sensing scheme to detect structural features of the electronic device. For example, the sense element may operate under an inductive sensing, capacitive sensing, and/or pressure sensing scheme. Under an inductive sensing scheme, the sense element may be configured to detect changes in a magnetic field caused by the proximity of an object to the wireless charging mat (see, e.g., FIGS. 2A-2G). Under a capacitive sensing scheme, the sense element may include one or an array of capacitive electrodes. The capacitive electrodes may be monitored for changes in capacitance resulting from the proximity of an electronic device to the wireless charging mat (see, e.g., FIGS. 3A-3G). Under a pressure sensing scheme, one or an array of pressure sensors may detect a deflection of the charging surface of the wireless charging mat and/or a force applied to the charging surface caused by placing an electronic device on the charging surface (see, e.g., FIGS. 4A-4D). A sense element may be further coupled to control circuitry and/or other components of the wireless charging mat (see, e.g., FIG. 5).

FIGS. 2A-2G depict examples of a wireless charging mat 200 detecting a location and orientation of an electronic device 202 through inductive sensing. In the examples depicted in FIGS. 2A-2G, one or more transmit coils 206 in the wireless charging mat 200 may be energized in order to induce a magnetic field near the transmit coil 206. If an object is near the transmit coil 206, the magnetic field may be altered. A sense element within the wireless charging mat 200 may detect the altered magnetic field and/or a reflected signal to determine the presence of an object. With an array of transmit coils 206 and/or sense elements, the wireless charging mat 200 may determine a location and orientation of objects on or near the charging surface 208.

Figure 2A:
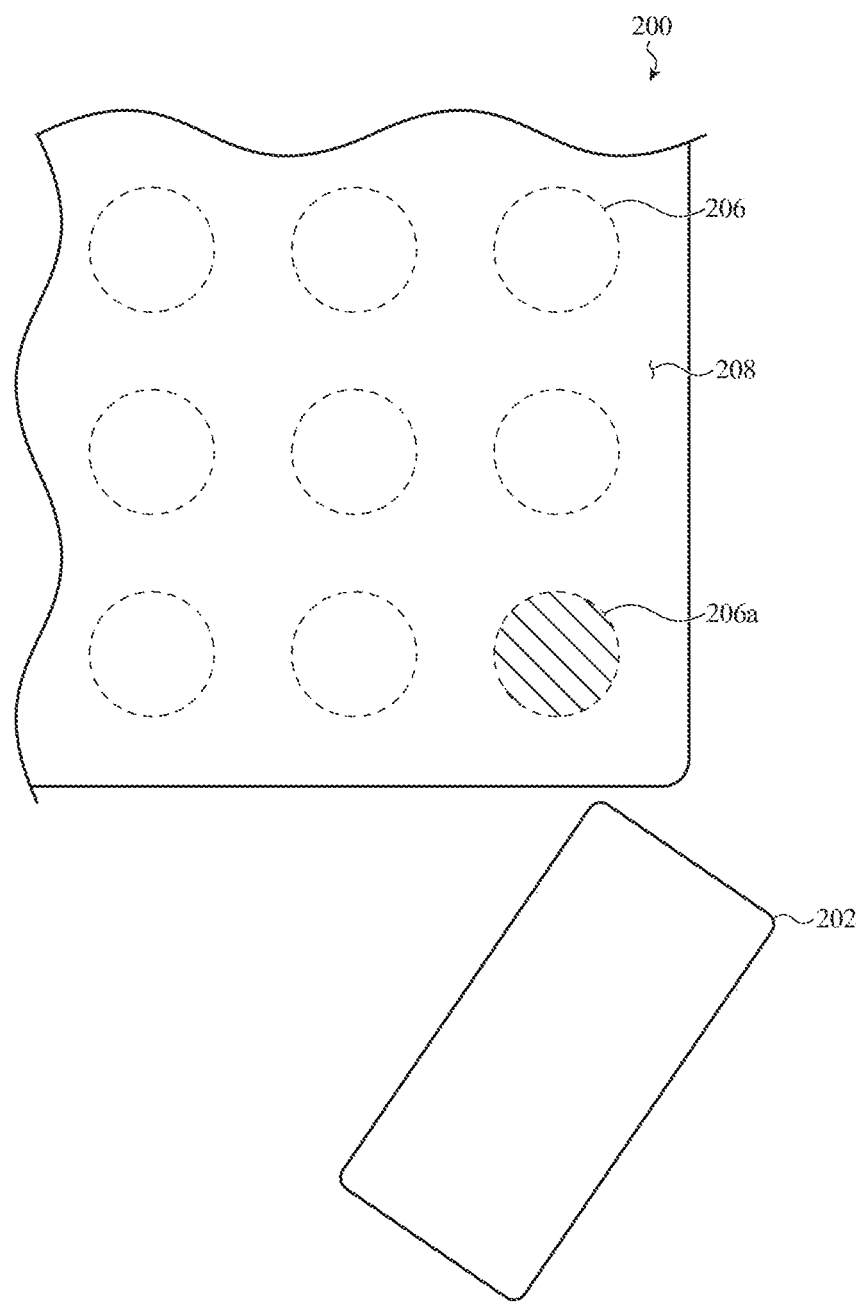
FIG. 2A depicts an example of a wireless charging mat configured to detect a nearby electronic device via inductive sensing.

FIG. 2A depicts a portion of a wireless charging mat 200 with an array of transmit coils 206. The transmit coils 206 are operated to detect proximate objects according to an inductive sensing scheme. In one example, a transmit coil 206 is periodically energized with a pulse signal. The pulse may be a direct current pulse or an alternating current pulse, and may have a suitable waveform, duty cycle, and frequency. In some embodiments, the pulse may have a varying frequency. The pulse may be activated with an appropriate amount of power to enable detection of objects proximate to the wireless charging mat 200.

When a transmit coil 206a is energized with a pulse signal, it generates a nearby magnetic field. The magnetic field may have a decay rate which may be detectable by a sense element within the wireless charging mat 200. As an object, such as an electronic device 202, approaches, it interacts with the magnetic field. For example, the decay rate of the magnetic field may be altered in response to the presence of the electronic device 202. The alteration of the magnetic field may differ depending on the proximity of the electronic device 202 to the transmit coil 206a and/or sense element, the wireless charging material composition of the electronic device 202, and so on.

The magnetic field may interact with features and/or structures of the electronic device 202, such as a housing and/or other non-charging components of the electronic device 202. In some embodiments, the decay rate may be increased or decreased as the magnetic field interacts with the protective case and/or non-charging components of the electronic device 202. In other embodiments, structures of the electronic device 202 may cause a resonant response in the magnetic field. These changes in the magnetic field may be detected by a sense element (e.g., by measuring the decay rate of a signal induced in the sense element, an induced resonant response, and so on).

In some embodiments, the sense element may be a transmit coil 206. The sense element may be the same transmit coil 206a that sent the pulse, or it may be another transmit coil 206, such as an adjacent transmit coil 206. In other embodiments, the sense element is a separate component of the wireless charging mat 200, such as a sensor or inductively responsive device.

Figure 2B:
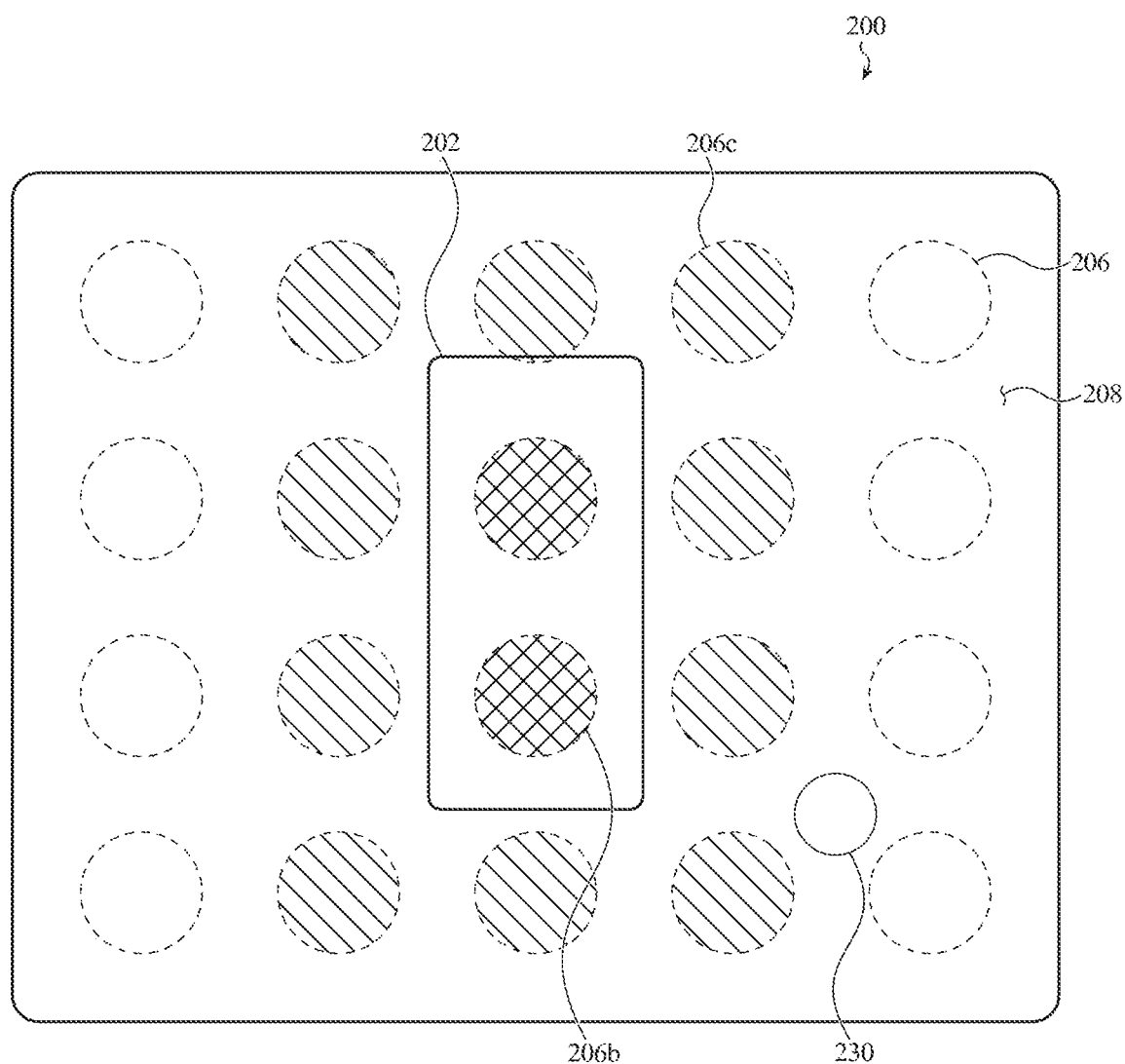
FIG. 2B depicts an example of a wireless charging mat configured to detect a location and an orientation of an electronic device via inductive sensing.
Figure 5:
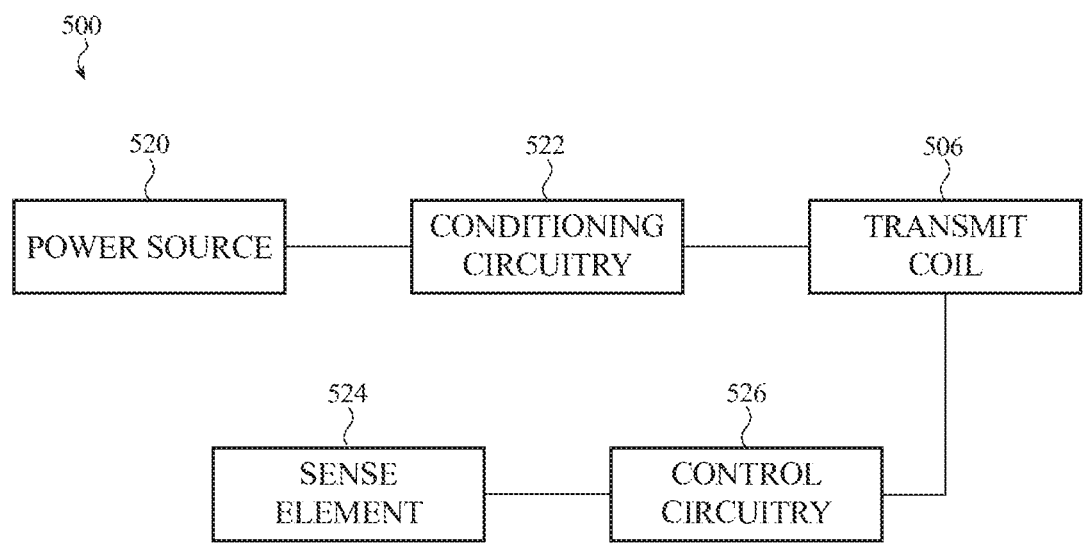
FIG. 5 depicts a simplified system diagram of certain example components of a wireless charging mat, such as described herein.

The transmit coil 206a and sense element (whether the same or a different component) may be part of an array of transmit coils 206 and sense elements, as depicted in FIG. 2B. Control circuitry (e.g., control circuitry 526 such as depicted in FIG. 5) may operate the array of transmit coils 206 and determine the location and orientation of objects such as an electronic device 202 based on the detected alteration of the magnetic field caused by the electronic device 202.

For example, as depicted in FIG. 2B, an electronic device 202 may be placed on a location of the charging surface 208 at least partially surrounded by transmit coils 206c. Some of the array of transmit coils 206, 206b, 206c may be regularly or intermittently pulsed. The sense elements corresponding to transmit coils 206b covered by the electronic device 202 may detect a particular response caused by structures of the electronic device 202 (e.g., a housing and/or other components of the electronic device 202). Other sense elements corresponding to transmit coils 206c surrounding the electronic device 202 may also detect a response, which may be distinct from the response detected by the covered transmit coils 206b (e.g., the detected response may be weaker).

Control circuitry connected to the sense elements may receive and interpret the response of the sense elements. For example, the control circuitry may determine characteristics (e.g., size and/or boundaries) of the electronic device 202 based on a comparison of the responses of different sense elements. The control circuitry may further determine the location and orientation of the electronic device 202 on the charging surface 208. For example, the control circuitry may infer or estimate a distance of the electronic device 202 and/or a structure of the electronic device 202 from a transmit coil 206 and/or sense element based on the magnitude of the detected response to the pulse.

The control circuitry may further determine the location and orientation of the electronic device 202 with reference to the charging surface 208 based on a comparison of the estimated distances of the electronic device 202 and/or structures of the electronic device 202 to each transmit coil 206 and/or sense element. For example, the sense elements may detect structural features of the electronic device 202 such as the shape and location of edges of the housing. Other structural features may indicate an orientation, such as a top or bottom edge of the housing. Based on these features and the distances of the features from the sense elements, the control circuitry may determine the location and the orientation of the electronic device 202 relative to the charging surface 208.

Based on the responses of the sense elements, the control circuitry may determine further characteristics of the electronic device 202. For example, the control circuitry may determine a type of the electronic device 202 (see, e.g., FIG. 2E). In other examples, the control circuitry may additionally or alternatively determine characteristics such as the location of internal features (e.g., receive coils, features which may interfere with or facilitate energy transfer, and so on), power requirements, and other characteristics relevant to operating the wireless charging mat 200.

In some embodiments all of the transmit coils 206 may be pulsed together. In other embodiments, only a portion of the transmit coils 206 may be pulsed together, or the transmit coils 206 may be pulsed in a sequential (i.e., round-robin) manner. In still other embodiments, energy may be conserved by initially pulsing one or a small subset of the transmit coils regularly or intermittently until an object is detected, then pulsing additional transmit coils 206 to determine additional information such as the position and orientation of the object.

In addition to detecting characteristics of an electronic device 202 on the charging surface 208, the sense elements are configured to detect other foreign objects, such as a coin 230. The control circuitry may identify the coin 230 as a foreign object and control the charging operations of the wireless charging mat 200 accordingly. For example, the coin 230 may be rejected as a receiving device and transmit coils 206 near the coin 230 may not be activated. If the coin 230 is near or beneath an electronic device 202 the control circuitry may further alter charging operations, e.g., by activating only transmit coils 206 away from the coin 230.

While FIGS. 2A and 2B were discussed operating with a pulsed signal, it should be understood that this is not required. The transmit coils 206 may instead be operated with a longer signal (including a continuous signal). The signal may be an alternating signal with an appropriate waveform, such as a sinusoidal, square, or triangular waveform. The frequency of the signal may be constant or varying. A transmit coil 206 may generate a magnetic field, which may cause a particular waveform in a sense element (e.g., another transmit coil 206 or a magnetic resonator circuit) when no object is present. When an object, such as an electronic device 202, is brought near the transmit coil 206, the waveform may be phase-shifted. The sense element may detect the phase shift and the control circuitry may determine the location and orientation of the electronic device 202 accordingly.

In other embodiments, the transmit coils 206 may be operated with a signal having a phase shift between the voltage and current waveforms of the signal. This may cause a corresponding phase shift detectable by a sense element when no object is present. When an object approaches, the detected phase shift between the voltage and current may change. The sense element may detect an amount of change in phase shift and the control circuitry may determine the location and orientation of the electronic device 202 accordingly. For example, the amount of the change in phase shift may correspond to a distance of the electronic device 202 and/or a structure of the electronic device 202 from a transmit coil 206 and/or sense element. The control circuitry may further determine the location and orientation of the electronic device 202 with reference to the charging surface 208 based on a comparison of estimated distances of the electronic device 202 and/or structures of the electronic device 202 to each transmit coil 206 and/or sense element based on the amount of the change in phase shift.

Turning to FIGS. 2C-2F, the electronic device 202c-202f may contain one or more non-charging structures (e.g., identifying structures) 232a-232n which may be detectable by the sense elements of the wireless charging mat 200. The structures 232a-232n may be resonant structures (e.g., non-charging inductive coils which resonate in the presence of an inductive field without transferring power to the electronic device), such as circuits which respond to the presence of a magnetic field by resonating at a particular frequency (e.g., LC circuits, RLC circuits, and so on). Each resonant structure 232a-232n within an electronic device 202c-202f may resonate at a distinct frequency which may be detectable by sense elements in the wireless charging mat 200.

For example, as depicted in FIG. 2C, an electronic device 202c may contain two resonant structures 232a, 232b. With two such resonant structures 232a, 232b the control circuitry of a charging mat may determine the position and orientation of the electronic device 202c. For example, sense elements near a resonant structure 232a may detect the resonant response of a pulsed magnetic field and infer or estimate a distance of the resonant structure 232a from the sense element (e.g., by detecting a rate of decay of the resonant response and/or the magnetic field). Control circuitry may further determine the location and orientation of the electronic device 202c with reference to the charging surface based on a comparison of the estimated distances of the resonant structures 232a, 232b with reference to nearby sense elements.

In certain embodiments this may be further enhanced where a first resonant structure 232a resonates at a first frequency and a second resonant structure 232b resonates at a second frequency. For example, the sense elements of the wireless charging mat may detect the location of the resonant structures 232a, 232b and the distinct resonant frequencies. Control circuitry connected to the sense elements may further determine the location and orientation of the electronic device 202c based on the response to the resonant structures 232a, 232b (e.g., by constructing a vector representing the position and orientation of the electronic device 202c relative to the charging surface).

In another example, as depicted in FIG. 2D, resonant structures 232c-232f may be positioned around a receive coil 216 of an electronic device 202d. Sense elements and/or control circuitry in a charging mat may detect the location of the resonant structures 232c-232f to further determine a position and orientation of both the electronic device 202d and the receive coil 216.

The receive coil 216 may be surrounded by resonant structures 232c-232f at positions above (e.g., the resonant structure 232c), to the right (e.g., the resonant structure 232d), below (e.g., the resonant structure 232e), and to the left (e.g., the resonant structure 232f) of the receive coil 216. One or more of the resonant structures 232c-232f may resonate at a distinct frequency from the others to distinguish the positions of the resonant structures 232c-232f. For example, the resonant structure above (e.g., the resonant structure 232c) the receive coil 216 may resonate at a first frequency while the resonant structures to the right (e.g., the resonant structure 232d), below (e.g., the resonant structure 232e), and to the left (e.g., the resonant structure 232f) of the receive coil 216 may resonate at a second frequency. In other embodiments, the resonant structures 232c-232f may resonate at more or fewer distinct frequencies, including each resonant structure 232c-232f resonating at a distinct frequency.

The sense elements and/or control circuitry of a charging mat may be configured to detect the resonant response of the resonant structures 232c-232f to a magnetic field produced by transmit coils. Where the resonant structures 232c-232f resonate at different frequencies, the sense elements may detect the frequency and control circuitry may determine a position and orientation of the electronic device 202d and the receive coil 216 based on the resonant responses. The control circuitry may further control charging operations based on the position and orientation of the electronic device 202d and/or the receive coil 216 (e.g., energizing transmit coils based on proximity to the receive coil 216 or proximate to a particular side of the receive coil 216).

In still another example, as depicted in FIG. 2E, resonant structures 232g-232k may additionally or alternatively provide a distinct signature that can be used to identify an electronic device 202e. For example, the resonant structures 232g-232k may be positioned in a number and pattern distinctive of the type of device. In other examples, each electronic device 202e may contain as few as one resonant structure 232g, which may resonate at a particular frequency distinctly identifying the type of electronic device 202e. For example, a first resonant frequency may identify the electronic device 202e as a phone, while a second frequency may identify the electronic device 202e as a tablet device. Or with two or more resonant structures 232g-232k, each may resonate at a distinct frequency, and the combination of frequencies may identify the type of electronic device 202e.

The signature of an electronic device 202e may be associated with the electronic device 202e and/or features of the electronic device 202e which may be used to operate the wireless charging mat. For example, the detection system may determine a location of a receive coil, locations of other components, and/or an amount of power to provide to the electronic device 202e based on the identification. For example, the control circuitry of a charging mat may be operatively coupled to a memory. The memory may store information such as a charging profile for different types of electronic devices 202e. For example, the memory may store a charging profile that may distinguish between a tablet device, a phone, a watch, and so on. In other examples, the charging profile may distinguish between devices by manufacturer, compliance with a charging standard, model, device generation, and so on. When the sense elements detect the distinct signature, the control circuitry may access memory to estimate a match between the signature and the charging profile. If the control circuitry estimates a sufficient match (e.g., a probability of a match exceeding a threshold), the charging profile may be used to affect the operation of the wireless charging mat.

A charging profile may contain information and/or instructions relevant to charging a particular type of electronic device 202. For example, the charging profile may identify a number and location of receive coils, the power requirements of the type of device, or the location of additional internal components (e.g., components which facilitate or interfere with charging). The wireless charging mat may then operate one or more transmit coils in accordance with the information and/or instructions of the charging profile. In some embodiments, multiple charging profiles may be stored in a lookup table or other data structure in the memory.

FIGS. 2D and 2E are depicted having four resonant structures 232c-232f and five resonant structures 232g-232k respectively. It should be understood that the number and arrangement of the resonant structures may vary in other embodiments.

Figure 2F:
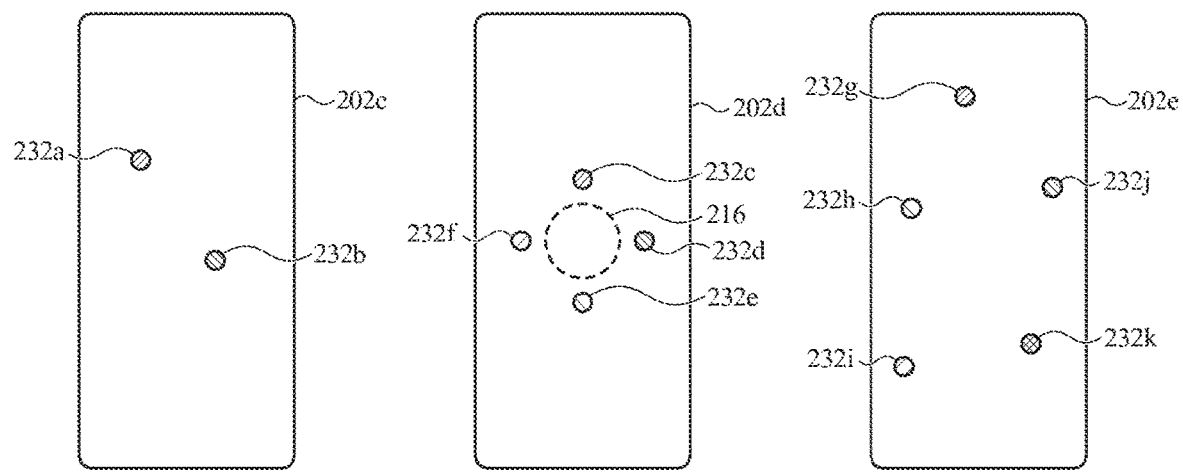
FIG. 2F depicts an example of a wireless charging mat detecting a location and an orientation of an electronic device having resonant structures via inductive sensing.
Figure 2F:
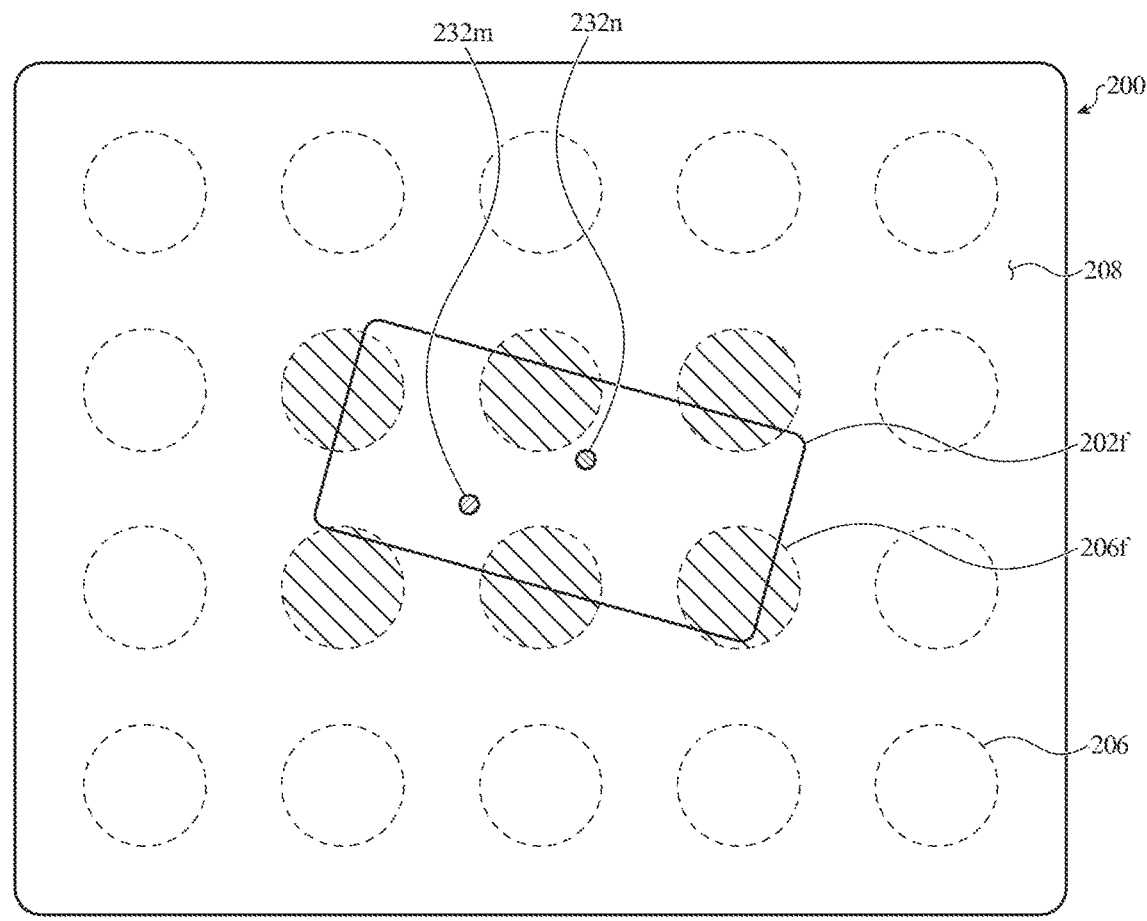

FIG. 2F depicts an electronic device 202f having resonant structures 232m, 232n. The electronic device 202f is positioned on a charging surface 208 of a charging mat 200. The resonant structures 232m, 232n may be similar to those depicted in FIG. 2C, 2D, or 2E. An electronic device 202f may be placed in a location at least partially surrounded by transmit coils 206f. Each of the array of transmit coils 206, 206f may be periodically pulsed. One or more of the sense elements corresponding to transmit coils 206f near the resonant structures 232m, 232n may detect a resonant frequency of the resonant structures 232m, 232n. In some embodiments, a first frequency may be detected corresponding to a first resonant structure 232m and a second frequency may be detected corresponding to a second resonant structure 232n.

Control circuitry (e.g., control circuitry 526 such as depicted in FIG. 5) connected to the sense elements may receive and interpret the response of the sense elements. For example, the control circuitry may determine the location of the electronic device 202f based on a comparison of the responses of different sense elements. The sense elements may detect responses as described above with respect to FIG. 2B, and may additionally detect the resonant response of the resonant structures 232m, 232n. The control circuitry may further determine the location and orientation of the electronic device 202f on the charging surface 208 based on the response of the sense elements.

In some embodiments, the control circuitry may determine further characteristics of the electronic device 202f. For example, the control circuitry may determine a position and orientation of a receive coil 216 (see, e.g., FIG. 2D) and/or a type of the electronic device 202f (see, e.g., FIG. 2E).

Figure 2G:
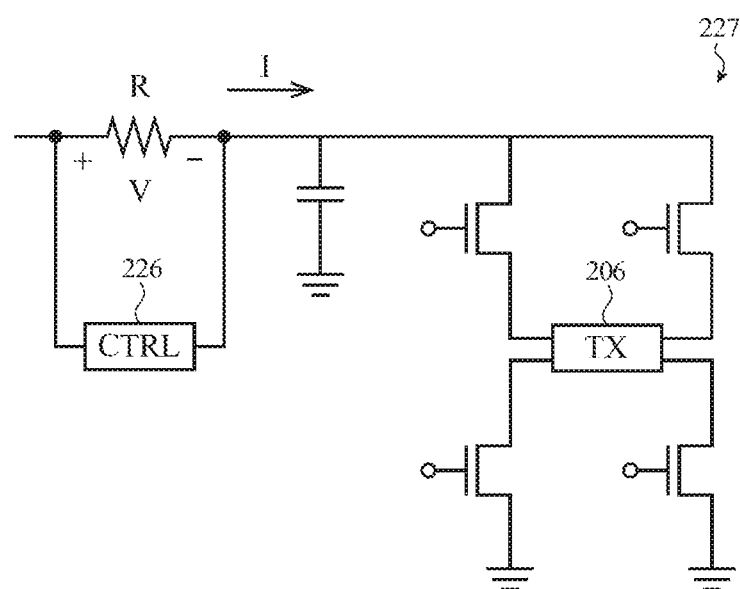
FIG. 2G depicts an example power transmission circuit including current sensing in a wireless charging mat.

FIG. 2G depicts an example power transmission circuit 227 configured for current sensing in a wireless charging mat (such as the wireless charging mat depicted in FIGS. 2A-2B). In some embodiments, one or more transmit coils 206 may be energized with an alternating current signal having any suitable waveform, duty cycle, and/or frequency. The transmit coil 206 may, when activated, enable detection of objects proximate to the wireless charging mat 200.

The transmit coil 206 may be energized by an incoming current I. Delivery of the incoming current I to the transmit coil 206 may be controlled through a switch network or other appropriate structure. Once the incoming current is delivered to the transmit coil 206, the transmit coil 206 generates a magnetic field. When the magnetic field interacts with one or more nearby objects, the transmit coil 206 may deliver power to the nearby object. For example, if an electronic device is placed near the transmit coil 206, features of the electronic device (e.g., non-charging structural features and/or a receive coil) may interact with the magnetic field, drawing power from the magnetic field.

When a nearby object, such as an electronic device, draws power from the magnetic field generated by the transmit coil 206, the current I delivered to the transmit coil increases to account for the load of the nearby object. Changes in the incoming current I from this interaction may be measured by control circuitry 226. For example, the incoming current I may correspond to a monitored voltage V, measured across a resistor R in the power transmission circuit 227. The control circuitry 226 may correlate the increase in current I to the presence of the nearby device.

The transmit coil 206 may be part of an array of transmit coils 206. The control circuitry 226 may monitor changes in current(s) delivered to multiple transmit coils in order to determine the location and orientation of various recognizable devices. In some examples, the increased current may be a result of delivering power to a receive coil within an electronic device on the charging surface of the wireless charging mat.

The change in current delivered to each of an array of transmit coils 206 may indicate a distance from a corresponding receive coil. For example, the current draw at a particular transmit coil 206 resulting from the presence of a receive coil may decrease (linearly, logarithmically, exponentially, or otherwise) with an increase in distance between the transmit coil 206 and the receive coil. With a known device and/or receive coil, the distance between the particular transmit coil 206 and the receive coil may be determined based on the measured change in current I resulting from the presence of the receive coil. In other examples, where power is being delivered to a receive coil, a change in distance between the transmit coil 206 and the receive coil may be determined based on a detected increase or decrease in the delivered current I.

With an array of transmit coils 206, the location and orientation of the electronic device may be determined by determining and comparing the distances between a receive coil and each transmit coil 206 in the array affected by the receive coil. For example, a distance may be determined between the receive coil and each of multiple transmit coils 206. The position of the receive coil may thus be determined based on the relative positions of the transmit coils 206 and the determined distances to the receive coil (for example, by triangulation or a similar method).

In other examples, as an electronic device is moved along the charging surface of the wireless charging mat, multiple transmit coils 206 may experience changes in the current drawn by each transmit coil 206. The changes in current may be compared to determine the position of the receive coil and/or the electronic device. In some embodiments, the increased current delivered to a transmit coil 206 may be a result of the magnetic field interacting with non-charging structural features (e.g., a battery or housing), and the position and orientation of the electronic device may be determined in a similar manner.

FIGS. 3A-3G depict examples of a wireless charging mat detecting a location and orientation of an electronic device through capacitive sensing. In the examples depicted in FIGS. 3A-3G, one or more capacitive sense elements 340a, 340b, 340c may monitor a capacitance, which capacitance may be altered by the presence of an object. With an array of capacitive sense elements 340a, 340b, 340c, the wireless charging mat 300 may determine a location and orientation of objects proximate to the charging surface 308.

Figure 3A:
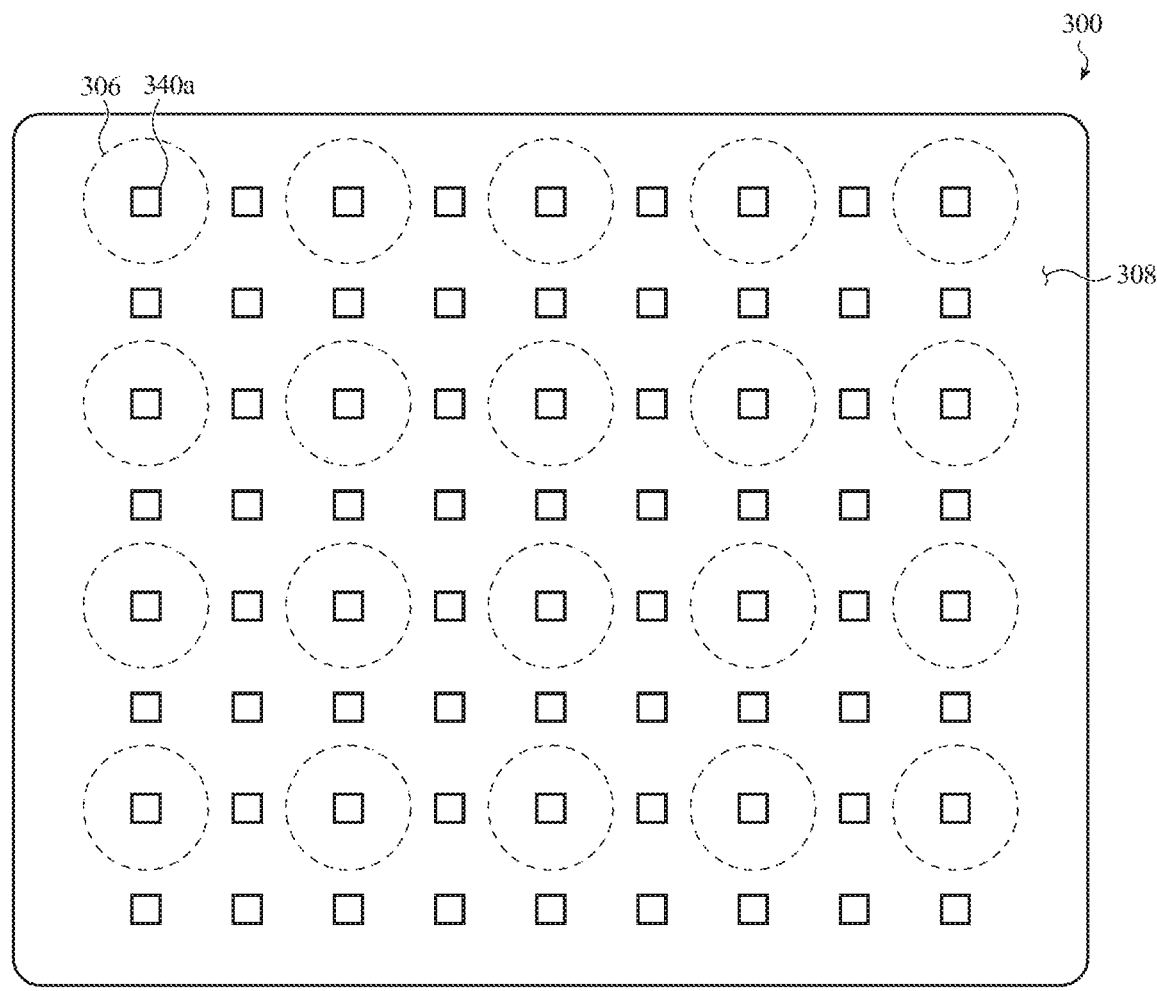
FIG. 3A depicts an example of a wireless charging mat configured to detect a location and an orientation of an electronic device via capacitive sensing.

FIG. 3A depicts a wireless charging mat 300 with an array of transmit coils 306 and an array of capacitive sense elements in the form of sense electrodes 340a. The sense electrodes 340a may be disposed on or near the charging surface 308 of the wireless charging mat 300. The sense electrodes 340a may be sized and/or positioned to limit any interference with the operation of the transmit coils 306. For example, the sense electrodes 340a may be positioned such that no sense electrode 340a overlaps a perimeter of a transmit coil 306. In other examples the sense electrodes 340a may overlap the transmit coils 306 but may be small and/or spaced sufficiently apart to limit any interference with the transmit coil 306 (e.g., interference with a magnetic field produced by the transmit coil 306).

The sense electrodes 340a may operate in accordance with a capacitive sensing scheme. In one example, the sense electrodes 340a may operate in accordance with a self-capacitive sensing scheme. Under this scheme, the array of sense electrodes 340a may detect the location of an object on or near the charging surface 308 by monitoring a change in self-capacitance of a small field generated by each electrode 340a.

The sense electrodes 340a may be formed by depositing or otherwise affixing a conductive material to a substrate material (e.g., a substrate adhered above or below the charging surface 308). Potential substrate materials include, for example, plastic, glass, or polymers such as polyimide, polyethylene terephthalate, or cyclo-olefin polymer. Example conductive materials include metals (e.g., copper, aluminum, gold, silver), polyethyleneioxythiophene, indium tin oxide, carbon nanotubes, graphene, piezoresistive semiconductor materials, piezoresistive metal materials, silver nanowire, other metallic nanowires, and the like. The conductors may be applied as a film or may be patterned into an array on the surface of the substrate using a printing, sputtering, or other deposition technique.

In some embodiments, the sense electrodes 340a are formed directly on the charging surface 308. The sense electrodes 340a may be formed directly onto the charging surface 308 using, for example, a stereo lithographic process or other similar technique for forming one or multiple conductive layers on a substrate.

The sense electrodes 340a may be operably coupled to control circuitry (e.g., control circuitry 526 such as depicted in FIG. 5). The control circuitry may include circuitry to detect a change in capacitance of the sense electrodes 340a. The control circuitry may monitor the change in capacitance to detect and estimate the location and orientation of objects on the charging surface 308 of the wireless charging mat 300. The sense electrodes 340a may be provided at a sufficient density to provide resolution to the control circuitry for determining both the position and orientation of an object.

For example, the response of sense electrodes 340a (e.g., the magnitude of the change in capacitance) in the array may be compared in order to detect structural features of the electronic device and determine the location of the structural features within the array. Features such as the location of protrusions, edges of the housing, and so on may be detected, and the control circuitry may determine the location and the orientation of the electronic device relative to the charging surface 308 based on the detected structural features.

Figure 3B:
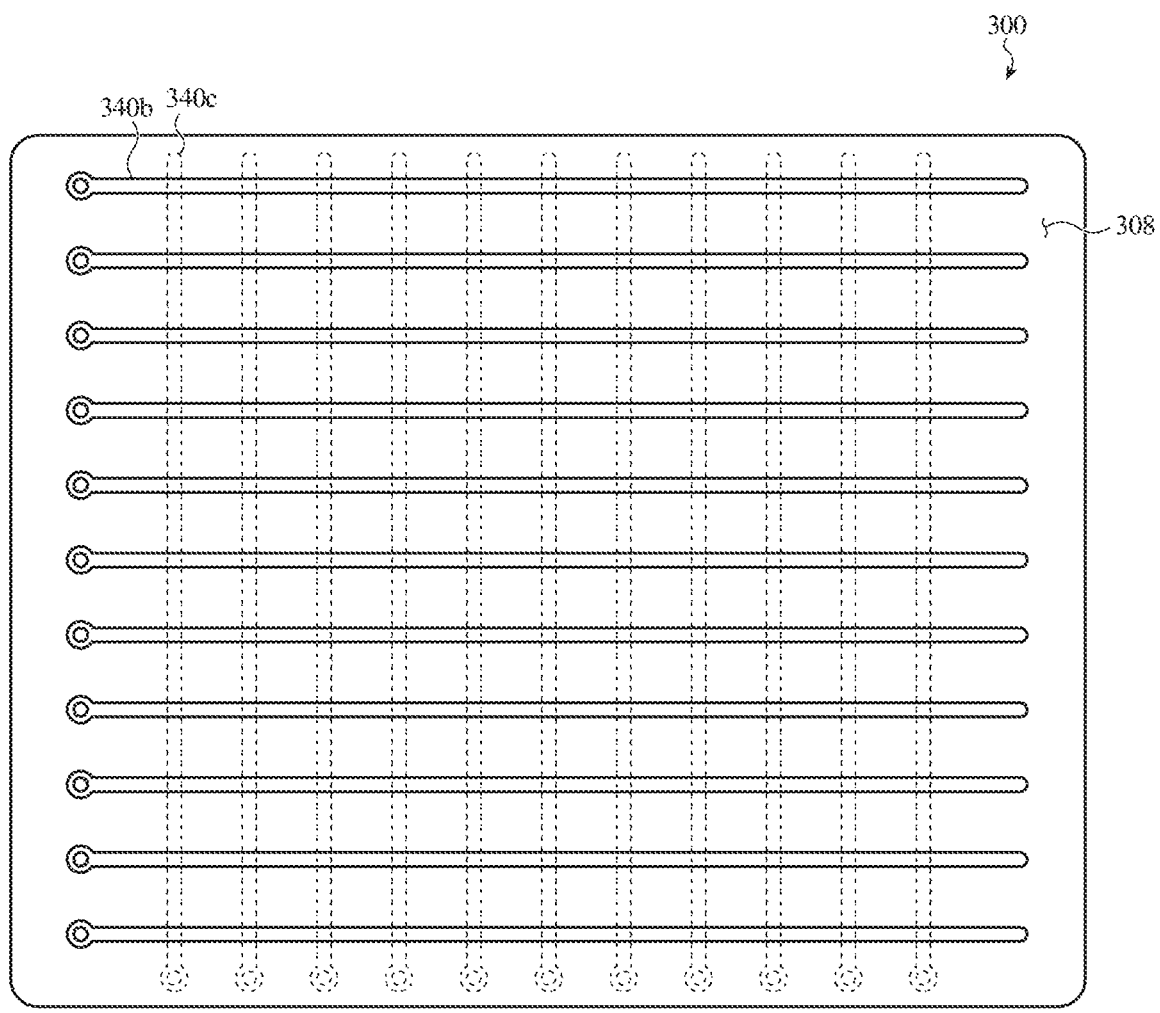
FIG. 3B depicts another example of a wireless charging mat configured to detect a location and an orientation of an electronic device via capacitive sensing

Alternatively, as depicted in FIG. 3B, capacitive sensing may be achieved through overlapping drive electrodes 340b and sense electrodes 340c. FIG. 3B depicts a wireless charging mat 300 with an array of capacitive sense elements in the form of rows of drive electrodes 340b overlapping columns of sense electrodes 340c. In other embodiments, the array of capacitive sense elements may be arranged in rows of sense electrodes and columns of drive electrodes. The drive electrodes 340b and sense electrodes 340c may be disposed on or near the charging surface 308 of the wireless charging mat 300. The drive electrodes 340b and sense electrodes 340c may be sized and/or positioned to limit any interference with the operation of the transmit coils.

The drive electrodes 340b and sense electrodes 340c may operate in accordance with an appropriate capacitive sensing scheme. In one example, the drive electrodes 340b and sense electrodes 340c may operate in accordance with a mutual-capacitance sensing scheme. Under this scheme, the drive electrodes 340b may be conductive rows disposed in a first layer while the sense electrodes 340c may be intersecting conductive columns disposed in a second layer. Control circuitry may be configured to detect the location of a touch by monitoring a change in capacitive or charge coupling between pairs of intersecting traces.

The drive electrodes 340b and sense electrodes 340c may be formed in a separate layer or integral to the charging surface 308 in a manner such as described above with respect to FIG. 3A. The drive electrodes 340b and sense electrodes 340c may further be operably coupled to control circuitry (e.g., control circuitry 526 such as depicted in FIG. 5). The control circuitry may include circuitry to detect a change in capacitance or charge coupling between an intersecting row and column. The control circuitry may monitor the change in capacitance to detect and estimate the location and orientation of objects on the charging surface 308 of the wireless charging mat 300. The drive electrodes 340b and sense electrodes 340c may be provided at a sufficient density to provide resolution to the control circuitry for determining both the position and orientation of an object.

Based on the responses of the drive electrodes 340b and sense electrodes 340c, the control circuitry may determine further characteristics of the electronic device. For example, the control circuitry may determine a type of the electronic device (see, e.g., FIG. 3F). In other examples, the control circuitry may additionally or alternatively determine characteristics such as the location of internal features (e.g., receive coils, features which may interfere with or facilitate energy transfer, and so on), power requirements, and other characteristics relevant to operating the wireless charging mat 300.

In addition to detecting characteristics of an electronic device on the charging surface 308, the drive electrodes 340b and sense electrodes 340c are configured to detect other foreign objects. The control circuitry may identify a foreign object and control the charging operations of the wireless charging mat 300 accordingly. For example, the foreign object may be rejected as a receiving device and transmit coils near the foreign object may not be activated. If the foreign object is near or beneath an electronic device the control circuitry may further alter charging operations, e.g., by activating only transmit coils away from the foreign object.

Figure 3C:
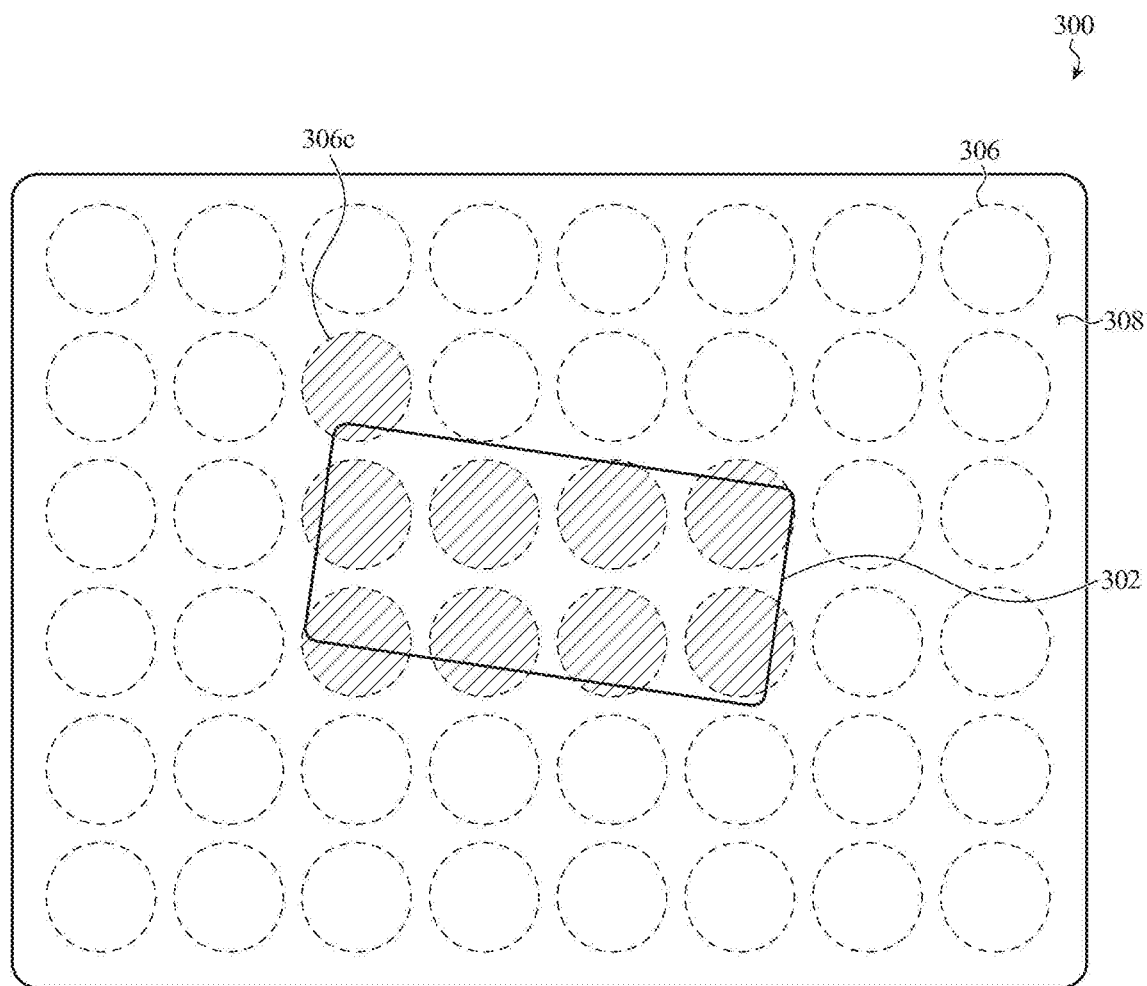
FIG. 3C depicts an example of a wireless charging mat configured to detect a location and an orientation of an electronic device via capacitive sensing using transmit coils.

In other embodiments, as depicted in FIG. 3C, a capacitive detection system may omit the sense electrodes of FIGS. 3A and 3B. Instead, the transmit coils 306, or a portion thereof, may be operated with a capacitive charge in an appropriate capacitive sensing scheme. As depicted in FIG. 3C, in some examples each transmit coil 306 may be operated in accordance with a self-capacitive sensing scheme. Under this scheme, the array of transmit coils 306 may detect the location of an object on or near the charging surface 308 by monitoring a change in self-capacitance of a small field generated by each transmit coil 306.

For example, an object, such as the electronic device 302, may be placed in a central region of the charging surface 308, covering and surrounded by transmit coils 306, 306c. The transmit coils 306c near the electronic device 302 may respond to the presence of the electronic device 302, while the surrounding transmit coils 306 do not change.

Control circuitry (e.g., control circuitry 526 such as depicted in FIG. 5) connected to the transmit coils 306, 306c may operate the transmit coils 306, 306c. In some embodiments, the control circuitry may provide a charge to each transmit coil 306, 306c, and the control circuitry may further monitor the capacitance of the transmit coils 306, 306c. The control circuitry may determine the location and orientation of the electronic device 302 relative to the charging surface 308 of the wireless charging mat 300 based on a change in the capacitance of one or more transmit coils 306c.

For example, the response of transmit coils 306 (e.g., the magnitude of the change in capacitance) in the array may be compared in order to detect structural features of the electronic device 302 and determine the location of the structural features relative to transmit coils 306, 306c within the array. Features such as the location of protrusions, edges of the housing, and so on may be detected, and the control circuitry may determine the location and the orientation of the electronic device 302 relative to the charging surface 308 based on the detected structural features.

In some embodiments, the control circuitry may determine further characteristics of the electronic device 302. For example, the control circuitry may determine a position and orientation of a receive coil 316 (see, e.g., FIG. 3E) and/or a type of the electronic device 302 (see, e.g., FIG. 3F).

In other embodiments, the capacitive detection system may include capacitive electrodes as in FIGS. 3A and/or 3B, and may also operate the transmit coils 306 as part of the capacitive detection system similar to the description of FIG. 3C. For example, the transmit coils 306 may be energized with a capacitive charge (e.g., as drive electrodes) and the capacitive electrodes may be operated as sense electrodes which detect a change in capacitance due to the presence of a nearby object.

Turning to FIGS. 3D-3G, the electronic device 302d-302g may contain one or more non-charging structures (e.g., identifying structures) 342a-342i which may be detectable by the sense elements of the wireless charging mat 300. The structures 342a-342i may be structures having a particular capacitive response (e.g., causing an increased or decreased capacitance), such as distinct materials in the housing of the electronic device (e.g., higher or lower density materials, more or less conductive materials) or non-charging circuits (e.g., RC circuits, RLC circuits, and so on) which cause a particular response in the sense elements. Such a capacitive structure 342a-342i may cause a distinct capacitive response in the sense elements of the wireless charging mat 300, such as an increased or decreased capacitance relative to the surrounding housing and/or components of the electronic device 302d-302g. In some examples, a capacitive structure 342a-342i may appear as a bright spot or dark spot within an inferred image based on the response of the sense elements of the wireless charging mat 300.

For example, as depicted in FIG. 3D, an electronic device 302d may contain a capacitive structure 342a configured to cause a distinct capacitive response in the sense elements of a charging mat. With the capacitive structure 342a, the control circuitry of the wireless charging mat may determine the position and orientation of the electronic device 302d. For example, the capacitive structure 342a may identify the orientation in an otherwise symmetrical electronic device 302d.

In another example, as depicted in FIG. 3E, non-charging capacitive structures 342b-342d may be positioned around a receive coil 316 of an electronic device 302e. Sense elements and/or control circuitry in a charging mat may detect the location of the capacitive structures 342b-342d to further determine a position and orientation of both the electronic device 302e and the receive coil 316.

The receive coil 316 may be surrounded by capacitive structures 342b-342d at positions which surround and triangulate a center of the receive coil 316. The pattern of the capacitive structures 342b-342d may further indicate the orientation of the electronic device 302e and/or receive coil 316. In other examples, one or more of the capacitive structures 342b-342d may cause a capacitive response distinct from the other structures to distinguish the positions of the capacitive structures 342b-342d.

The sense elements and/or control circuitry of a charging mat may be configured to detect the response to the capacitive structures 342b-342d. The control circuitry may further control charging operations based on the position and orientation of the electronic device 302e and/or the receive coil 316 (e.g., energizing transmit coils based on proximity to the receive coil 316 or near a particular side of the receive coil 316).

In still another example, as depicted in FIG. 3F, capacitive structures 342e-342h may additionally or alternatively provide a distinct signature for identification of an electronic device 302f. For example, the capacitive structures 342e-342h may be positioned in a number and pattern distinctive of the type of device.

Similar to the embodiment depicted in FIG. 2E, the signature of an electronic device 302f may provide identification of the electronic device 302f and/or features of the electronic device 302f, which may be used to operate the wireless charging mat. For example, the detection system may determine a location of a receive coil, locations of other components, and/or an amount of power to provide to the electronic device 302f based on the identification. The detection system may further be operated on the basis of information and/or instructions related to the signature.

FIGS. 3E and 3F are depicted having three capacitive structures 342b-342d and four capacitive structures 342e-342h respectively. It should be understood that the number and arrangement of the capacitive structures may vary in other embodiments.

Figure 3G:
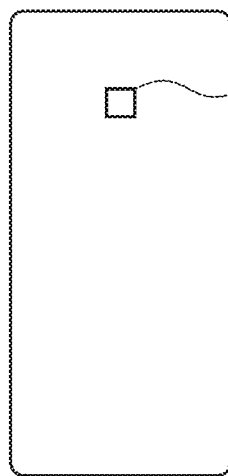
FIG. 3G depicts an example of a wireless charging mat detecting, via capacitive sensing, a location and an orientation of an electronic device having capacitive structures.
Figure 3G:
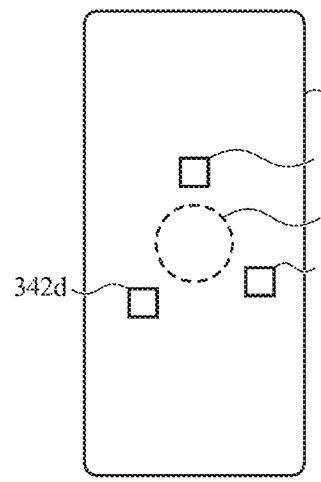
Figure 3G:
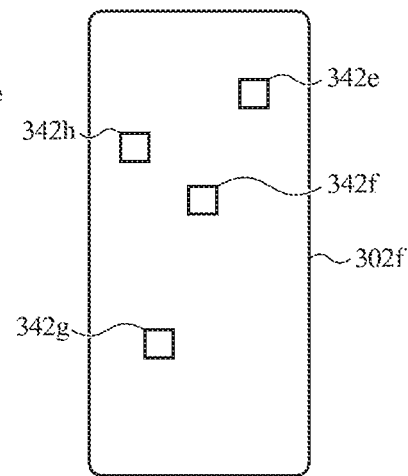
Figure 3G:
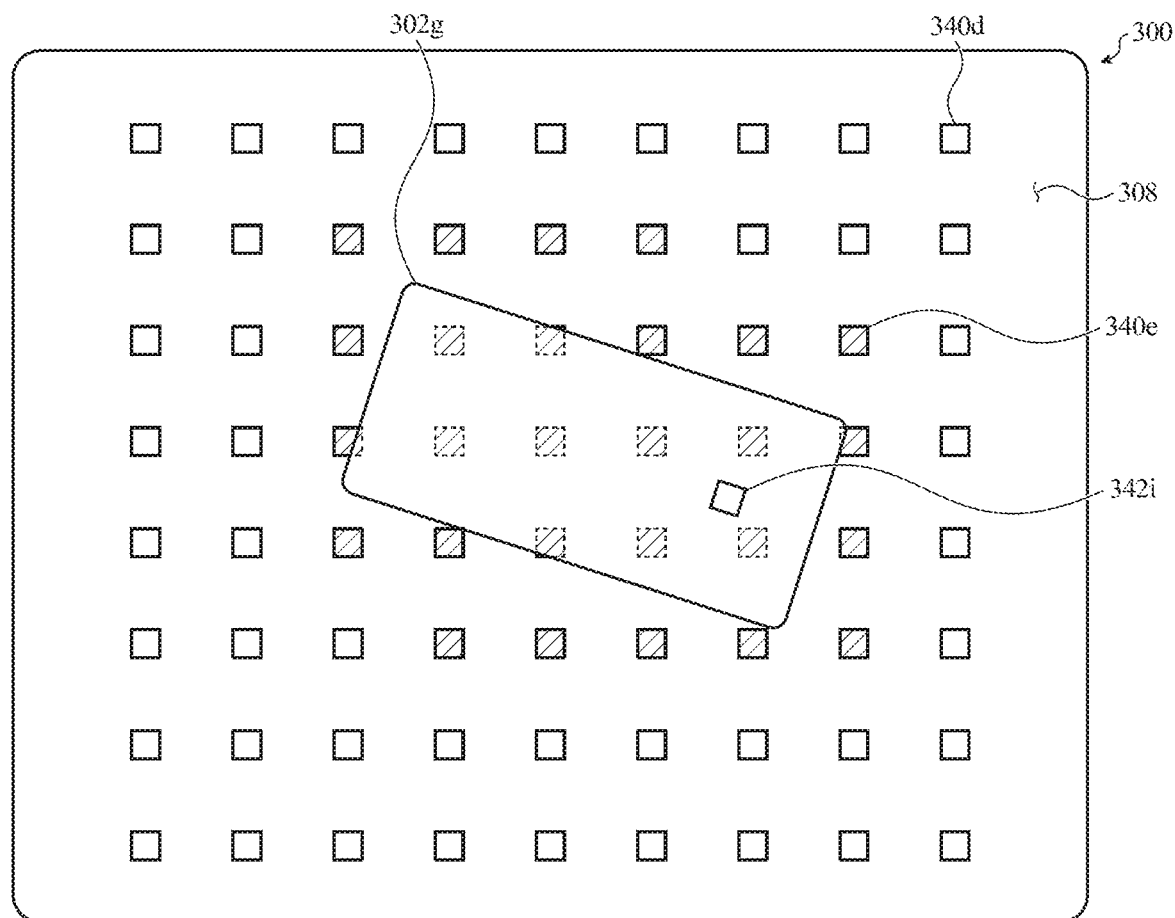

FIG. 3G depicts an electronic device 302g having a capacitive structure 342i. The electronic device 302g is positioned on a charging surface 308 of a charging mat 300. In some embodiments, the wireless charging mat 300 has one or an array of capacitive sense elements 340d, 340e which may be similar to the examples depicted in FIG. 3A or FIG. 3B. In other embodiments, the wireless charging mat 300 operates the transmit coils as capacitive sense elements similar to the example depicted in FIG. 3C. The capacitive structure 342i of the electronic device 302g may be similar to those depicted in FIG. 3D, 3E, or 3F.

An electronic device 302g may be placed in a central region of the charging surface 308, covering and surrounded by sense elements 340e. The sense elements 340e near the electronic device 302g may respond to the presence of the electronic device 302g. One or more of the sense elements 340e near the capacitive structure 342i may further detect a location of the capacitive structure 342i.

Control circuitry (e.g., control circuitry 526 such as depicted in FIG. 5) connected to the sense elements 340e may operate the sense elements 340e. In some embodiments, the control circuitry may provide a charge to a sense element 340e, and the control circuitry may further monitor the capacitance of the sense element 340e. The control circuitry may determine the location and orientation of the electronic device 302g relative to the charging surface 308 of the wireless charging mat 300 based on a change in the capacitance of one or more sense elements 340e.

The sense elements 340e may additionally have a particular response to the capacitive structure 342i. The control circuitry may further determine the location and orientation of the electronic device 302g on the charging surface 308 based on the response of the sense elements 340e to the capacitive structure 342i.

In some embodiments, the control circuitry may determine further characteristics of the electronic device 302g. For example, the control circuitry may determine a position and orientation of a receive coil 316 (see, e.g., FIG. 3E) and/or a type of the electronic device 302g (see, e.g., FIG. 3F).

FIGS. 4A-4D depict examples of a wireless charging mat 400 detecting a location and orientation of an electronic device through pressure sensing. In the examples depicted in FIGS. 4A-4D one or more pressure sensors 450 may be configured to respond to a depression in the charging surface 408 or a force applied to the charging surface 408 of the wireless charging mat 400. With one or an array of pressure sensors 450 the wireless charging mat 400 may determine a location and orientation of objects on or near the charging surface 408.

Figure 4A:
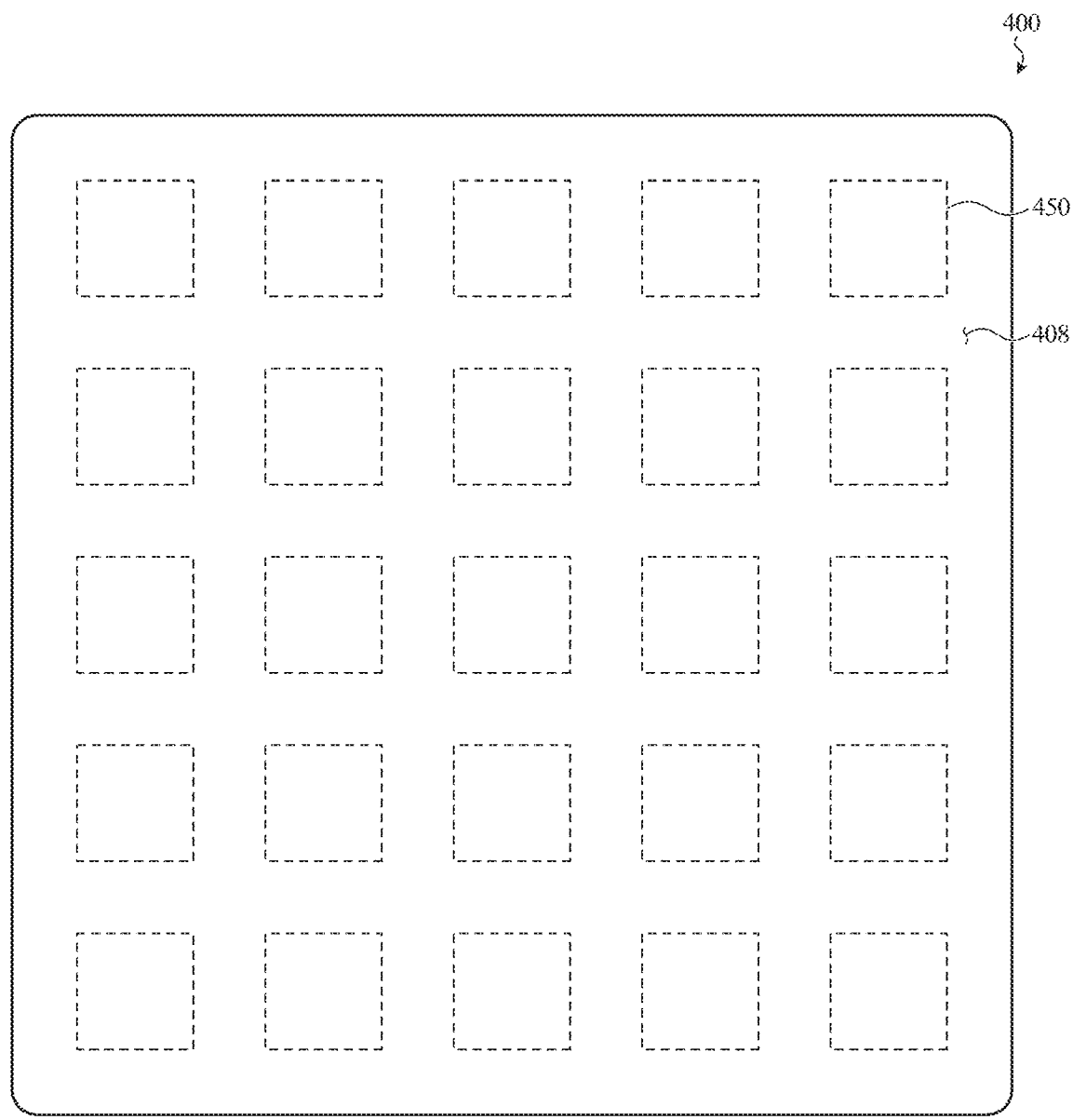
FIG. 4A depicts an example of a wireless charging mat configured to detect a location and an orientation of an electronic device via pressure sensing.

FIG. 4A depicts a wireless charging mat 400 with an array of pressure sensors 450. The pressure sensors 450 may be disposed below the charging surface 408 of the wireless charging mat 400. The pressure sensors 450 may be used to estimate a magnitude of force and/or deflection in the charging surface 408 caused by the placement of an object on the charging surface 408. The pressure sensors 450 may further form a pressure sensing layer (see, e.g., FIG. 4B).

Figure 4B:
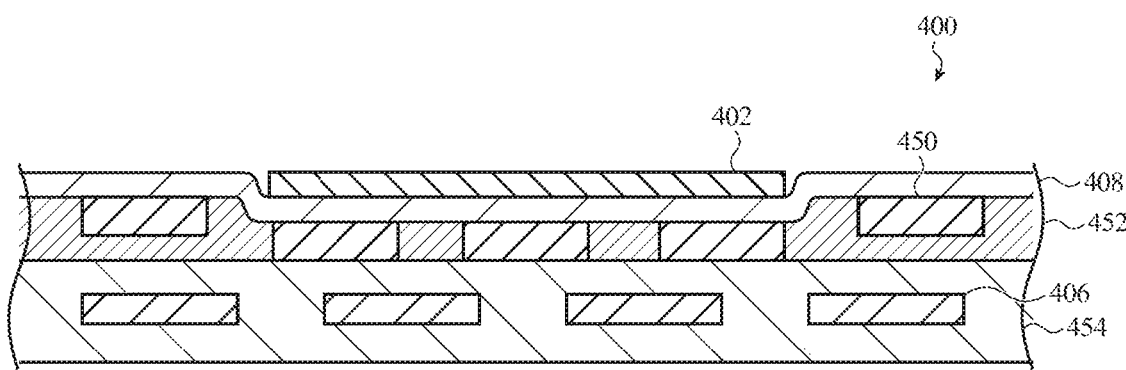
FIG. 4B depicts a simplified cross-sectional view of a wireless charging mat configured to detect a location and an orientation of an electronic device via pressure sensing.

FIG. 4B depicts a simplified cross-sectional view of the wireless charging mat 400 depicted in FIG. 4A, illustrating layers of the wireless charging mat 400. The wireless charging mat 400 includes a charging surface 408, a pressure sensing layer 452, and a transmit coil layer 454. The transmit coil layer 454 includes one or more transmit coils 406, configured to transfer energy from the wireless charging mat 400 to the electronic device 402. The wireless charging mat 400 includes additional components (such as depicted in FIG. 5), and may include additional layers not depicted in FIG. 4B. As illustrated, the placement of an electronic device 402 may result in a deflection and/or force at the charging surface 408, which deflection and/or force is transferred to the pressure sensing layer 452.

The pressure sensing layer 452 includes an array of pressure sensors 450 which may operate in accordance with various pressure-sensing principles. In some embodiments, the pressure sensors 450 are formed from a strain-sensitive material, such as a piezoresistive, piezoelectric, or similar material having an electrical property that changes in response to stress, strain, and/or deflection. Example strain-sensitive materials include carbon nanotube materials, graphene-based materials, piezoresistive semiconductors, piezoresistive metals, metal nanowire material, and the like. Each pressure sensor 450 may be formed from an individual block of strain-sensitive material that is electrically coupled to sensing circuitry (such as control circuitry 526 as depicted in FIG. 5). Alternatively, each pressure sensor 450 may be formed from an electrode pair that is positioned on opposite sides or ends of a strain-sensitive sheet.

In some embodiments, the pressure sensors 450 are formed from a capacitive pressure-sensitive structure that includes at least two capacitive plates separated by a compliant or compressible layer. The placement of an object, such as an electronic device 402, may cause the partial compression or deflection of the compressible layer and may cause the two capacitive plates to move closer together, which may be measured as a change in capacitance using sensing circuitry (e.g., control circuitry 526 such as depicted in FIG. 5) operatively coupled to each of the pressure sensors 450. The change in capacitance, which corresponds to an amount of compression or deflection of the compressible layer, may indicate a location of an electronic device 402.

Alternatively, the pressure sensors 450 may operate in accordance with an optical or resistive sensing principle. For example, the placement of an object on the charging surface 408 may cause a compression of a compliant or compressible layer which may be detected using an optical sensor. In some embodiments, compression of the compressible layer may result in contact between two or more layers, which may be detected by measuring the continuity or resistance between the layers.

The arrangement and density of the pressure sensors 450 may vary depending on the implementation. For example, in order to determine the location and orientation of an electronic device 402, multiple pressure sensors 450 may be provided at a density sufficient to resolve features of the electronic device 402, such as the location of edges, size, and/or shape of the electronic device 402.

The pressure sensors 450 may be operably coupled to control circuitry (e.g., control circuitry 526 such as depicted in FIG. 5). The control circuitry may in some embodiments be configured to detect the amount of force resulting from placement of an electronic device 402. In other embodiments, the control circuitry may be configured to detect a deflection and/or compression in the pressure sensing layer 452 caused by the presence of the electronic device 402. The control circuitry may monitor the inputs from multiple pressure sensors 450 to detect and estimate the location and orientation of objects on the charging surface 408 of the wireless charging mat 400.

Figure 4C:
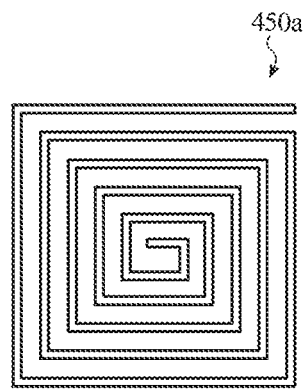
FIG. 4C depicts an example of a pressure sensor in the form of a strain gauge.

In some embodiments, a pressure sensor 450a may be a strain gauge, such as depicted in FIG. 4C. The strain gauge is a strain-sensitive element configured to measure a change in a strain-responsive electrical property of the strain-sensitive element. In some cases, the strain gauge may exhibit a change in resistance in response to a change in strain. The pressure sensor 450a incorporating the strain gauge may produce a non-binary output that corresponds to an amount of deflection in the charging surface 408 or an amount of applied force resulting from the electronic device 402 on the charging surface 408.

In general, the pressure sensor 450 may be optically opaque (or alternatively transparent) for integration within a laminated stack, such as depicted in FIG. 4B. As illustrated in FIG. 4B, the pressure sensor 450 is implemented in a pressure sensing layer 452. The pressure sensing layer 452 may include a substrate having an array of pressure sensors 450 in the form of strain gauges on one or more surfaces of the substrate.

In one configuration, a pressure sensor 450a includes a strain gauge formed as a conductive material having a linear spiral shape or geometry as illustrated in FIG. 4C. In other embodiments, the shape or geometry of the strain gauge may vary. In some embodiments, the strain gauge may include a set of conductive traces arranged in a forked or comb-shaped configuration. The traces may alternatively have a serpentine shape having elongated portions forming the primary traces. Other shapes include, but are not limited to: linear serpentine shapes, radial serpentine shapes, spiral shapes, doubled-back spiral shapes, and so on.

The conductive material of the pressure sensor 450a may include materials such as, but not limited to: copper, gold, constantan, karma, isoelastic, indium tin oxide, or any combination thereof. The substrate on which the conductive material is deposited may include materials such as, but not limited to: plastic, ceramic, glass, polyimide, polyethylene terephthalate, or any combination thereof. The conductive material of the pressure sensor 450a may be formed or deposited on a surface using a suitable disposition technique such as, but not limited to: vapor deposition, sputtering, printing, roll-to-roll processing, gravure, pick and place, adhesive, mask-and-etch, and so on.

Each pressure sensor 450a may further be electrically coupled to pressure-sensing circuitry (which may be incorporated into control circuitry) to measure or estimate an amount of strain registered along the corresponding portion of the pressure sensing layer 452. The pressure-sensing circuitry and/or control circuitry may then determine a location and orientation of the electronic device 402. The wireless charging mat 400 may be operated in accordance with the determined location and orientation.

Figure 4D:
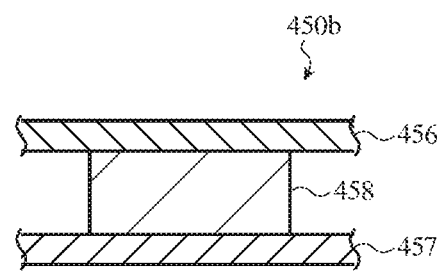
FIG. 4D depicts an example of a pressure sensor in the form of a piezoelectric element.

In other embodiments, a pressure sensor 450b may be a piezoelectric-based sensor, such as depicted in FIG. 4D. The piezoelectric-based sensor is configured to have an electrical response to a force or pressure applied to the charging surface 408, such as from the placement or removal of an electronic device 402. The pressure sensor 450b may be disposed in a pressure sensing layer within an array of pressure sensors 450b.

The pressure sensor 450b may include a piezoelectric substrate 458 bonded to a sense electrode 456 and a ground electrode 457. In some embodiments, the sense electrode 456 and/or ground electrode 457 may be deposited directly on the piezoelectric substrate 458.

The piezoelectric substrate 458 may be formed from a suitable material, such as a ceramic piezoelectric material. Example materials include lead zirconate titanate, lead titanate, quartz, sodium potassium niobate, bismuth ferrite, and other suitable piezoelectric materials. The piezoelectric substrate 458 may be a crystalline material having an electrical response upon alteration of the crystal structure. For example, a charge may accumulate on or near a surface of the piezoelectric substrate 458 when it is compressed, which may cause production of an electrical signal that may correspond linearly to the amount of pressure or force causing the compression.

The sense electrode 456 and ground electrode 457 may be formed from a suitable material, such as metals (e.g., copper, gold, silver, aluminum), polyethyleneioxythiophene, indium tin oxide, carbon nanotubes, graphene, piezoresistive semiconductor materials, piezoresistive metal materials, silver nanowire, other metallic nanowires, and the like. The sense electrode 456 and ground electrode 457 may be formed from the same or a different material. Accumulation of charge on the piezoelectric substrate 458 may be measured as an electrical potential or signal across the sense electrode 456 and ground electrode 457.

The sense electrode 456 and/or ground electrode 457 may be operably coupled to pressure sensing circuitry, which may form part of control circuitry. The pressure sensing and/or control circuitry may be configured to detect and estimate an amount of pressure or force applied to the charging surface 408 by the electronic device 402. The control circuitry may further determine a location and orientation of the electronic device based on the detected pressure. The wireless charging mat 400 may be operated in accordance with the determined location and orientation.

For example, the responses of an array of pressure sensors may be compared to determine a location and an orientation of the electronic device 402. The control circuitry may determine structural features such as the edges of the housing of the electronic device by comparing, e.g., the magnitude of pressure measured at various locations. Other structural features may indicate an orientation, such as a top or bottom edge of the housing (e.g., a protrusion that results in a greater pressure measurement in a circumscribed area). Based on these features and the corresponding locations of the pressure sensors 450 detecting the structural features, the control circuitry may determine the location and the orientation of the electronic device 402 relative to the charging surface 408.

FIG. 5 depicts a simplified schematic view of components of a wireless charging mat 500 incorporating a detection system such as described herein. The wireless charging mat 500 includes a power source 520, which may provide alternating current power. The alternating current power source 520 can deliver alternating current with any suitable amplitude or frequency. In one example, the alternating current power source 520 is connected to the output of a step-up converter (not shown) which can be configured to accept variable mains voltage as input (e.g., 110 VAC-250 VAC). In this case, the step-up converter may be configured to increase mains voltage to 400 VAC, or any other suitable voltage level that is reliably higher than the maximum expected mains voltage level (e.g., 250 VAC).

Incoming power may pass from the power source 520 through conditioning circuitry 522. The conditioning circuitry 522 may alter the power according to the requirements for output at the transmit coil 506. For example, the conditioning circuitry 522 may alter the voltage, current, frequency, phase, and/or other aspects of the incoming power in order to arrive at a desired output for a transmit coil 506. The transmit coil 506 may be configured to wirelessly transfer power to a receive coil via resonant inductive power transfer. The transmit coil 506 may be energized with an alternating current signal received from the conditioning circuitry 522 to induce an alternating current in a coupled receive coil. The conditioning circuitry 522 may include a number of other components, such as a rectifier, a buck converter, boost converter, filters, boost/buck converter, and so forth, which have been omitted from FIG. 5 for clarity. In some cases, the incoming power from the power source 520 may be a direct current. In such cases, the conditioning circuitry 522 may additionally convert the direct current to an appropriate alternating current for the transmit coil 506.

In some embodiments, elements of the power source 520 and/or conditioning circuitry 522 may form part of the wireless charging mat 500. In other embodiments, one or both of the power source 520 and conditioning circuitry 522 may be separate from the wireless charging mat 500.

The transmit coil 506 may be electrically coupled to control circuitry 526. The control circuitry 526 may selectively activate the transmit coil 506. While the control circuitry 526 is depicted outside the line of power transmission to the transmit coil 506, in other embodiments the control circuitry 526 may be within the power transmission line. The control circuitry 526 is configured to interrupt and/or control transmission of power to the transmit coil 506.

The control circuitry 526 may further be operatively connected to computer memory via an electronic bus or bridge. The control circuitry 526 may include one or more computer processors or microcontrollers that are configured to perform, interrupt, or coordinate operations in response to computer-readable instructions. Additionally or alternatively, the control circuitry 526 may include other processors including application specific integrated chips and other microcontroller devices.

The memory may include a variety of types of non-transitory computer-readable storage media, including, for example, read access memory, read-only memory, erasable programmable memory, or flash memory. The memory is configured to store computer-readable instructions, sensor values, lookup tables, and/or other persistent software elements.

In this example, the control circuitry 526 may be operable to read computer-readable instructions stored on the memory. The computer-readable instructions may adapt the control circuitry 526 to perform the operations or functions described herein, such as determining the location and orientation of a device based on inputs received from the sense element 524. The computer-readable instructions may be provided as a computer-program product, software application, or the like.

The sense element 524 is configured to detect a location of structural features (e.g., features of a housing and/or non-charging structural features) of objects on a charging surface of the wireless charging mat 500. The sense element 524 may operate under an appropriate sensing scheme, such as inductive sensing, capacitive sensing, and/or pressure sensing. Under an inductive sensing scheme, the sense element 524 may be configured to detect changes in a magnetic field caused by the proximity of an object to the wireless charging mat 500 (see, e.g., FIGS. 2A-2G). Under a capacitive sensing scheme, the sense element 524 may include one or an array of capacitive electrodes. The capacitive electrodes may be monitored for changes in capacitance resulting from the proximity of an electronic device to the wireless charging mat 500 (see, e.g., FIGS. 3A-3G). Under a pressure sensing scheme, one or an array of pressure sensors may detect a deflection of the charging surface of the wireless charging mat 500 and/or a force applied to the charging surface caused by placing an electronic device on the charging surface (see, e.g., FIGS. 4A-4D).

The sense element 524 is operatively coupled to the control circuitry 526 in order to provide signals representing the sensed location of the structural features of objects. In some embodiments, the sense element 524 is also operated by inputs from the control circuitry 526. Generally and broadly, the sense element 524 and/or control circuitry 526 are considered to be a detection system. The control circuitry 526 thereafter determines the position and orientation of the object (e.g., an electronic device) based on the sensed structural features. Examples of the detection system are depicted above with respect to FIGS. 2A-4D. Example operations of the wireless charging mat, including operation of the detection system, are depicted below with respect to FIGS. 6 and 7.

Figure 6:
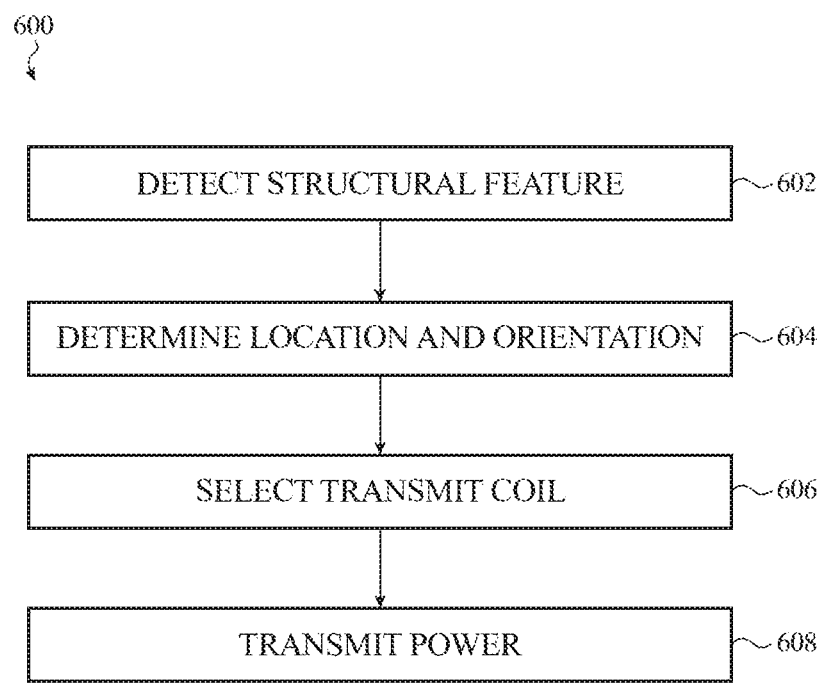
FIG. 6 depicts an example process for charging an electronic device on a wireless charging mat.

FIG. 6 depicts an example process 600 for charging an electronic device on a wireless charging mat. The process 600 may be implemented on any of the example devices discussed above with respect to FIGS. 1A-5. The following process 600 may be used to determine a location and an orientation of an electronic device using, for example, the sense element and control circuitry described with respect to FIG. 5 or other embodiments described herein. In some embodiments, the process 600 may be implemented as processor-executable instructions that are stored within a memory of the device.

In operation 602, a structural feature of the electronic device is detected. The detected structural feature may be a feature of a housing and/or other component of the electronic device. The structural feature may be detected via an appropriate sensing scheme, such as inductive sensing, capacitive sensing, and/or pressure sensing. Under an inductive sensing scheme, operation 602 may detect (e.g., using a sense element) changes in a magnetic field caused by the proximity of the structural feature to the wireless charging mat. Under a capacitive sensing scheme, operation 602 may detect (e.g., using one or an array of capacitive electrodes) a change in capacitance resulting from the proximity of the structural feature of the electronic device to the wireless charging mat. Under a pressure sensing scheme, operation 602 may detect (e.g., by one or an array of pressure sensors) a deflection of the charging surface of the wireless charging mat and/or a force at the charging surface caused by contact between structural features of the electronic device and the charging surface. Signals or other indicia may be generated in operation 602. The signals or other indicia may represent a distance between the structural feature and a sense element and/or a detected location of the structural element on the charging surface of the wireless charging mat.

In operation 604, a location and an orientation of the electronic device with respect to the charging surface of the wireless charging mat are determined in response to the detected structural feature. The signals or other indicia generated in operation 602 may be interpreted to determine a location and an orientation of the electronic device. For example, characteristics of the electronic device (e.g., size and/or boundaries) may be determined (e.g., by control circuitry) based on a comparison of signals or other indicia (e.g., signals received from different sense elements) detected in operation 602. The location and the orientation of the electronic device may further be determined based on these characteristics, for example by estimating a distance of the structural feature from a sense element based on the magnitude of the signals or other indicia.

In operation 606, a transmit coil is selected based on the determined location and orientation of the electronic device. For example, operation 606 may typically energize a transmit coil only in response to the presence of an electronic device sufficiently near the transmit coil to couple the transmit coil to a receive coil within the electronic device. In other examples, a wireless charging mat may incorporate an array of transmit coils, and the determined position and orientation of the electronic device may be used to select a transmit coil which is positioned for more efficient power transfer to a receive coil within the electronic device. The transmit coil may be selected based on appropriate criteria. For example, the transmit coil nearest the electronic device and/or nearest a receive coil within the electronic device may be selected. In other cases, the transmit coil may additionally or alternatively be selected based on the orientation of the electronic device with respect to the charging surface.

In operation 608, power is wirelessly transmitted to the electronic device using the selected transmit coil. The transmit coil may be configured to wirelessly transfer power to a receive coil via resonant inductive power transfer. In operation 608, the transmit coil may be energized with an alternating current signal to induce an alternating current in a coupled receive coil of the electronic device. The induced alternating current may transmit power to the electronic device to power components of the electronic device, charge a battery, and so on. The operations of process 600 are merely illustrative in nature and are not intended to be limiting.

Figure 7:
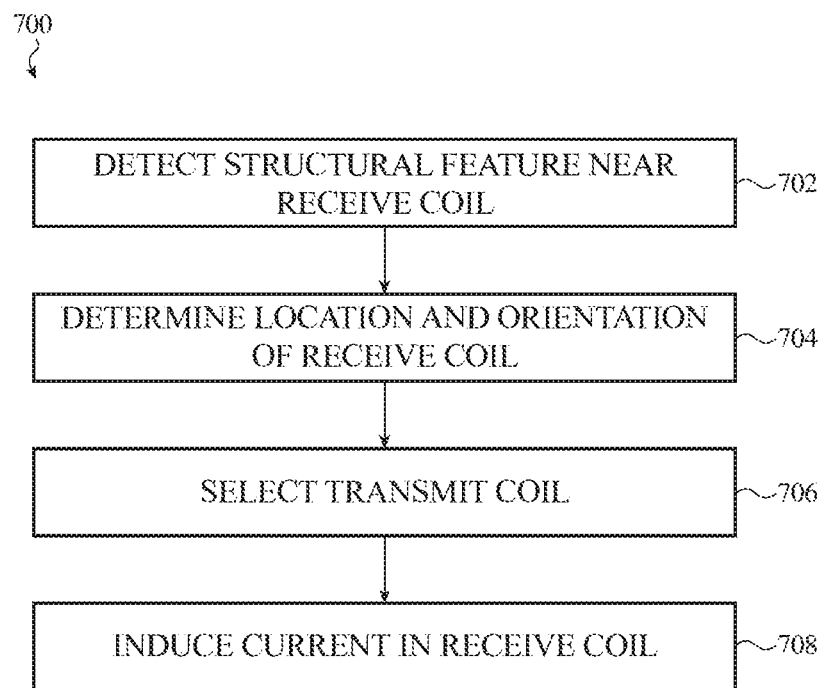
FIG. 7 depicts an example process for transmitting power to a receive coil of an electronic device on a wireless charging mat.

FIG. 7 depicts an example process 700 for transmitting power to a receive coil of an electronic device on a wireless charging mat. The process 700 may be implemented on any of the example devices discussed above with respect to FIGS. 1A-5. The following process 700 may be used to determine a location and an orientation of a receive coil of an electronic device on a charging surface of the wireless charging mat using, for example, the sense element and control circuitry described with respect to FIG. 5 or other embodiments described herein. In some embodiments, the process 700 may be implemented as processor-executable instructions that are stored within a memory of the device.

In operation 702, a position, relative to the charging surface, of a non-charging structural feature of the electronic device adjacent the receive coil is detected. The detected non-charging structural feature may be a component, a feature of the housing, and/or a circuit of the electronic device positioned adjacent the receive coil. The non-charging structural feature does not transfer power to the electronic device. The position of the non-charging structural feature may be detected via an appropriate sensing scheme, such as inductive sensing, capacitive sensing, and/or pressure sensing. Under an inductive sensing scheme, operation 702 may detect (e.g., using a sense element) changes in a magnetic field caused by the proximity of the structural feature to the wireless charging mat. Under a capacitive sensing scheme, operation 702 may detect (e.g., using one or an array of capacitive electrodes) a change in capacitance resulting from the proximity of the structural feature to the wireless charging mat. Under a pressure sensing scheme, operation 702 may detect (e.g., by one or an array of pressure sensors) a deflection of the charging surface of the wireless charging mat and/or a force at the charging surface caused by contact between the structural feature and the charging surface. Signals or other indicia may be generated in operation 702. The signals or other indicia may represent a distance between the structural feature and a sense element and/or a detected location of the non-charging structural feature on the charging surface of the wireless charging mat.

In operation 704, a location and an orientation of the receive coil relative to the charging surface of the wireless charging mat are determined. The location and the orientation are determined based on the detected position of the non-charging structural feature adjacent the receive coil. The determination of the location and the orientation of the receive coil may further be made by interpreting the signals or other indicia generated in operation 702. For example, a distance of the non-charging structural feature from a sense element may be estimated (e.g., by control circuitry) based on the magnitude of the signals or other indicia. In other examples, the signals or other indicia (e.g., signals received from different sense elements) detected in operation 702 may be compared to determine the location and the orientation of the receive coil.

In operation 706, a transmit coil is selected based on the determined location and orientation of the receive coil. For example, operation 706 may typically energize a transmit coil only in response to the presence of a receive coil near enough to be coupled to the transmit coil. In other examples, a wireless charging mat may incorporate an array of transmit coils, and the determined position and orientation of the receive coil may be used to select a transmit coil which is positioned for more efficient power transfer to the receive coil. The transmit coil may be selected based on appropriate criteria. For example, the transmit coil nearest the receive coil may be selected. In other cases, the transmit coil may additionally or alternatively be selected based on the orientation of the receive coil with respect to the charging surface.

In operation 708, a current is induced in the receive coil using the selected transmit coil. The transmit coil may be configured to induce a current in the receive coil via resonant inductive power transfer. In operation 708, the transmit coil may be energized with an alternating current signal to induce an alternating current in the coupled receive coil. The induced alternating current may transmit power to the electronic device to power components of the electronic device, charge a battery, and so on.

Many embodiments of the foregoing disclosure may include or may be described in relation to various methods of operation, use, manufacture, and so on. Notably, the operations of methods presented herein are meant only to be exemplary and, accordingly, are not necessarily exhaustive. For example an alternate operation order or fewer or additional steps may be required or desired for particular embodiments.

In accordance with an embodiment, a wireless charging mat configured to wirelessly transmit power to an electronic device having a housing with non-charging structural features is provided that includes an enclosure having an upper surface configured to receive the electronic device, a set of transmit coils configured to wirelessly transmit power to the electronic device on the upper surface, and a detection system configured to, detect positions of the non-charging structural features of the housing of the electronic device relative to the upper surface, and determine a location and an orientation of the electronic device relative to the upper surface based on the detected positions.

In accordance with another embodiment, the wireless charging mat includes control circuitry operatively coupled to the detection system and configured to activate a subset of the set of transmit coils to transmit the wireless power based on the determined location and the determined orientation.

In accordance with another embodiment, the detection system is configured to energize the transmit coils to detect the positions of the non-charging structural features using inductive sensing.

In accordance with another embodiment, the electronic device has a receive coil configured to receive the wirelessly transmitted power, the non-structural features include first and second resonant structures configured to resonate respectively at first and second distinct frequencies, and the detection system is configured to use the set of transmit coils to transmit signals, detect a first resonant response of the first resonant structure at the first frequency in response to the signals and detect a second resonant response of the second resonant structure at the second frequency in response to the signals.

In accordance with another embodiment, the detection system is configured to use the first and second detected resonant responses to detect the positions of the first and second resonant structures.

In accordance with another embodiment, the detection system includes a set of capacitive electrodes disposed on or below the upper surface.

In accordance with another embodiment, the detection system is configured to detect the positions of the non-charging structural features of the housing of the electronic device relative to the upper surface by detecting distinct capacitive responses of the non-charging structural features.

In accordance with another embodiment, the detection system includes a set of strain sensors.

In accordance with another embodiment, the detection system includes a piezoelectric sensor configured to detect a deflection of the upper surface in response to the electronic device contacting the upper surface.

In accordance with another embodiment, the detection system is further configured to determine a type of the electronic device.

In accordance with another embodiment, the detection system is configured to detect an identifying structure of the housing of the electronic device, and determine the type of the electronic device based on the detected identifying structure.

In accordance with an embodiment, a method for charging an electronic device on a wireless charging mat having a detection system is provided that includes with the detection system, detecting a first position of a first structural feature of a housing of the electronic device relative to a charging surface of the wireless charging mat, with the detection system, detecting a second position of a second structural feature of the housing of the electronic device relative to the charging surface of the wireless charging mat, determining a location and an orientation of the electronic device on the wireless charging mat based on the detected first position and the detected second position, selecting a transmit coil in the wireless charging mat based on the determined location and the determined orientation, and wirelessly transmitting power to the electronic device using the transmit coil.

In accordance with another embodiment, the transmit coil is a first transmit coil, the method includes periodically energizing a second transmit coil with a pulsed signal, detecting a response to the pulsed signal, and determining the location and the orientation of the electronic device based on a characteristic of the response to the pulsed signal.

In accordance with another embodiment, the response includes a first resonant frequency caused by the pulsed signal interacting with a first structure of the electronic device, and a second resonant frequency caused by the pulsed signal interacting with a second structure of the electronic device.

In accordance with another embodiment, the transmit coil is a first transmit coil, the method includes periodically energizing a second transmit coil with a signal, detecting a response to the signal, and determining the location and the orientation of the electronic device based on the response to the signal having a phase shift.

In accordance with another embodiment, the method includes detecting a change in capacitance in two or more of a set of capacitive sense elements, and determining the location and the orientation of the electronic device based on the change in capacitance.

In accordance with another embodiment, the method includes detecting a change in pressure in two or more of a set of pressure sensors, and determining the location and the orientation of the electronic device based on the change in pressure.

In accordance with an embodiment, a wireless charging mat is provided that includes a housing having a charging surface, a set of transmit coils in the housing that are configured to wirelessly transmit power to an electronic device on the charging surface and a detection system configured to, detect a first position of a first non-charging structural feature of the electronic device relative to the charging surface, detect a second position of a second non-charging structural feature of the electronic device relative to the charging surface, and determine a location and an orientation of a receive coil in the electronic device relative to the charging surface based on the detected first position and the detected second position.

In accordance with another embodiment, the location and the orientation are determined based on the first position of the first non-charging structural feature adjacent the receive coil and the second position of the second non-charging structural feature adjacent the receive coil.

In accordance with another embodiment, the wireless charging mat includes control circuitry operatively coupled to the detection system and configured to activate a subset of the set of transmit coils based on the location and the orientation.

In accordance with another embodiment, the detection system includes at least one of the set of transmit coils, and a sense element, and the at least one of the set of transmit coils transmits a signal and the sense element detects a response to the signal.

In accordance with another embodiment, the sense element is a first sense element, the first sense element is configured to detect a first resonant response at a first frequency of the first non-charging structural feature to the signal and the detection system includes a second sense element configured to detect a second resonant response at a second frequency of the second non-charging structural feature to the signal.

In accordance with another embodiment, the first non-charging structural feature and the second non-charging structural feature are positioned adjacent the receive coil.

In accordance with another embodiment, the detection system a set of capacitive electrodes disposed on or below the charging surface.

In accordance with another embodiment, the set of capacitive electrodes is configured to detect a distinct capacitive response of the first non-charging structural feature, and the orientation is determined based on the first position.

In accordance with an embodiment, a method for transmitting power to a receive coil of an electronic device on a wireless charging mat is provided that includes detecting a position on the wireless charging mat of a non-charging structural feature of the electronic device adjacent the receive coil, determining a location and an orientation of the receive coil relative to a charging surface based on the detected position, selecting a transmit coil based on the determined location and the determined orientation, and causing the transmit coil to induce a current in the receive coil.

In accordance with another embodiment, the transmit coil is a first transmit coil, and the method includes periodically energizing a second transmit coil with a pulsed signal, detecting a response to the pulsed signal caused by the non-charging structural feature, and determining the location and the orientation of the receive coil based on the response to the pulsed signal.

In accordance with another embodiment, the non-charging structural feature is a first non-charging structural feature, and the response includes a first resonant frequency caused by the pulsed signal interacting with the first non-charging structural feature of the electronic device, and a second resonant frequency caused by the pulsed signal interacting with a second non-charging structural feature of the electronic device.

In accordance with another embodiment, the transmit coil is a first transmit coil, the method includes periodically energizing a second transmit coil with a signal, detecting a response to the signal and detecting the location and the orientation of the electronic device based on the response to the signal having a phase shift.

In accordance with another embodiment, the non-charging structural feature is detected by a change in capacitance in a capacitive sense element.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

For example, although the location and orientation of a wireless charging mat, an electronic device, and components of the wireless charging mat and/or electronic device are generally referenced herein with respect to a locally-defined Cartesian coordinate system (having an origin in the bottom left corner of a given figure), one of skill in the art will appreciate that such a coordinate system is not required for any particular embodiment, and other coordinate systems, or cooperation of multiple coordinate systems, can be used in reference to the embodiments described herein. In addition, while some components or devices are described with relative positions (e.g., above, below, left, right, and so on), it should be appreciated that these relative positions are exemplary only and other relative positions would also be within the scope of this disclosure.

What is claimed is:

1. A wireless charging mat configured to wirelessly transmit power to an electronic device having a housing with non-charging structural features, comprising:
   an enclosure having an upper surface configured to receive the electronic device;
   a set of transmit coils configured to wirelessly transmit power to the electronic device on the upper surface; and
   a detection system configured to:
      detect positions of the non-charging structural features of the housing of the electronic device relative to the upper surface, wherein the non-charging structural features include first and second resonant structures configured to resonate respectively at first and second distinct frequencies; and
      determine a location and an orientation of the electronic device relative to the upper surface based on the detected positions.

2. The wireless charging mat of claim 1, further comprising control circuitry operatively coupled to the detection system and configured to activate a subset of the set of transmit coils to transmit the wireless power based on the determined location and the determined orientation.

3. The wireless charging mat of claim 1, wherein the detection system is configured to energize the transmit coils to detect the positions of the non-charging structural features using inductive sensing.

4. The wireless charging mat of claim 3, wherein the electronic device has a receive coil configured to receive the wirelessly transmitted power, and wherein the detection system is configured to:
   use the set of transmit coils to transmit signals;
   detect a first resonant response of the first resonant structure at the first frequency in response to the signals; and
   detect a second resonant response of the second resonant structure at the second frequency in response to the signals.

5. The wireless charging mat of claim 4 wherein the detection system is configured to use the first and second detected resonant responses to detect the positions of the first and second resonant structures.

6. The wireless charging mat of claim 1, wherein the detection system comprises a set of capacitive electrodes disposed on or below the upper surface.

7. The wireless charging mat of claim 6, wherein the detection system is configured to:
   detect the positions of the non-charging structural features of the housing of the electronic device relative to the upper surface by detecting distinct capacitive responses of the non-charging structural features.

8. The wireless charging mat of claim 1, wherein the detection system comprises a set of strain sensors.

9. The wireless charging mat of claim 1, wherein the detection system comprises a piezoelectric sensor configured to detect a deflection of the upper surface in response to the electronic device contacting the upper surface.

10. The wireless charging mat of claim 1, wherein the detection system is further configured to determine a type of the electronic device.

11. The wireless charging mat of claim 10, wherein the detection system is configured to:
    detect an identifying structure of the housing of the electronic device; and
    determine the type of the electronic device based on the detected identifying structure.

12. A method for charging an electronic device on a wireless charging mat having a detection system, comprising:
    with the detection system, detecting a first position of a first structural feature of a housing of the electronic device relative to a charging surface of the wireless charging mat;
    with the detection system, detecting a second position of a second structural feature of the housing of the electronic device relative to the charging surface of the wireless charging mat;
    periodically energizing a first transmit coil with a pulsed signal;
    detecting a response to the pulsed signal;
    determining a location and an orientation of the electronic device on the wireless charging mat based on the detected first position, the detected second position, and a characteristic of the response to the pulse signal;
    selecting a second transmit coil in the wireless charging mat based on the determined location and the determined orientation; and
    wirelessly transmitting power to the electronic device using the second transmit coil.

13. The method of claim 12, wherein the response comprises:
    a first resonant frequency caused by the pulsed signal interacting with a first structure of the electronic device; and
    a second resonant frequency caused by the pulsed signal interacting with a second structure of the electronic device.

14. The method of claim 12, wherein determining the location and the orientation of the electronic device on the wireless charging mat comprises determining the location and the orientation of the electronic device based on the response to the signal having a phase shift.

15. The method of claim 12, further comprising:
    detecting a change in capacitance in two or more of a set of capacitive sense elements; and
    determining the location and the orientation of the electronic device based on the change in capacitance.

16. The method of claim 12, further comprising:
detecting a change in pressure in two or more of a set of pressure sensors; and
determining the location and the orientation of the electronic device based on the change in pressure.

17. A wireless charging mat, comprising:
a housing having a charging surface;
a set of transmit coils in the housing that are configured to wirelessly transmit power to an electronic device on the charging surface; and
a detection system having at least one of the set of transmit coils configured to transmit a signal, a first sense element configured to detect a first resonant response at a first frequency of a first non-charging structural feature to the signal, and a second sense element configured to detect a second resonant response at a second frequency of a second non-charging structural feature to the signal, the detection system being configured to:
detect a first position of the first non-charging structural feature of the electronic device relative to the charging surface;
detect a second position of the second non-charging structural feature of the electronic device relative to the charging surface; and
determine a location and an orientation of a receive coil in the electronic device relative to the charging surface based on the detected first position and the detected second position.

18. The wireless charging mat of claim 17, wherein the location and the orientation are determined based on the first position of the first non-charging structural feature adjacent the receive coil and the second position of the second non-charging structural feature adjacent the receive coil.

19. The wireless charging mat of claim 18, further comprising control circuitry operatively coupled to the detection system and configured to activate a subset of the set of transmit coils based on the location and the orientation.

20. The wireless charging mat of claim 17, wherein the first non-charging structural feature and the second non-charging structural feature are positioned adjacent the receive coil.

21. The wireless charging mat of claim 17, wherein the detection system comprises a set of capacitive electrodes disposed on or below the charging surface.

22. The wireless charging mat of claim 21, wherein:
the set of capacitive electrodes is configured to detect a distinct capacitive response of the first non-charging structural feature; and
the orientation is determined based on the first position.

23. A method for transmitting power to a receive coil of an electronic device on a wireless charging mat, comprising:
detecting a position on the wireless charging mat of a non-charging structural feature of the electronic device adjacent the receive coil;
periodically energizing a plurality of transmit coils with signals;
detecting responses to the signals;
determining a location and an orientation of the receive coil relative to a charging surface based on the detected position and the responses to the signals having phase shifts;
selecting one of the plurality of transmit coils based on the determined location and the determined orientation; and
causing the selected one of the plurality of transmit coils to induce a current in the receive coil.

24. The method of claim 23, wherein the non-charging structural feature is detected by a change in capacitance in a capacitive sense element.

* * * * *